(12) United States Patent
Singh et al.

(10) Patent No.: US 10,672,795 B2
(45) Date of Patent: Jun. 2, 2020

(54) BULK SEMICONDUCTOR SUBSTRATE CONFIGURED TO EXHIBIT SEMICONDUCTOR-ON-INSULATOR BEHAVIOR

(71) Applicant: Taiwan Semiconductor Manufacturing Co., Ltd., Hsin-Chu (TW)

(72) Inventors: Gulbagh Singh, Hsinchu (TW); Kun-Tsang Chuang, Miaoli County (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 6 days.

(21) Appl. No.: 16/118,098

(22) Filed: Aug. 30, 2018

(65) Prior Publication Data

US 2020/0006386 A1    Jan. 2, 2020

Related U.S. Application Data

(60) Provisional application No. 62/690,545, filed on Jun. 27, 2018.

(51) Int. Cl.
*H01L 27/01*       (2006.01)
*H01L 27/12*       (2006.01)
(Continued)

(52) U.S. Cl.
CPC ........ *H01L 27/1203* (2013.01); *H01L 21/265* (2013.01); *H01L 21/76224* (2013.01);
(Continued)

(58) Field of Classification Search
CPC ............. H01L 27/1203; H01L 29/0649; H01L 21/76224; H01L 21/84; H01L 21/265;
(Continued)

(56) References Cited

U.S. PATENT DOCUMENTS

| | | | |
|---|---|---|---|
| 8,673,736 B2 | 3/2014 | Yang et al. | |
| 8,685,847 B2 * | 4/2014 | Majumdar | ........ H01L 29/66545 257/347 |

(Continued)

*Primary Examiner* — Shouxiang Hu
(74) *Attorney, Agent, or Firm* — Haynes and Boone, LLP

(57) ABSTRACT

Bulk semiconductor substrates configured to exhibit semiconductor-on-insulator (SOI) behavior, and corresponding methods of fabrication, are disclosed herein. An exemplary bulk substrate configured to exhibit SOI behavior includes a first isolation trench that defines a channel region of the bulk substrate and a second isolation trench that defines an active region that includes the channel region. The first isolation trench includes a first isolation trench portion and a second isolation trench portion disposed over the first isolation trench portion. A first isolation material fills the first isolation trench portion, and an epitaxial material fills the second isolation trench portion. The epitaxial material is disposed on the first isolation material. A second isolation material fills the second isolation trench. A portion of the bulk substrate underlying the first isolation trench and the channel region is configured to have a higher resistance than the bulk substrate.

20 Claims, 18 Drawing Sheets

(51) Int. Cl.
    *H01L 29/10*      (2006.01)
    *H01L 21/265*      (2006.01)
    *H01L 21/84*      (2006.01)
    *H01L 21/762*      (2006.01)
    *H01L 29/06*      (2006.01)
    *H01L 29/66*      (2006.01)
    *H01L 29/78*      (2006.01)
    *H01L 29/786*      (2006.01)

(52) U.S. Cl.
    CPC .......... *H01L 21/84* (2013.01); *H01L 29/0649* (2013.01); *H01L 29/1033* (2013.01); *H01L 29/66636* (2013.01); *H01L 29/66772* (2013.01); *H01L 29/7848* (2013.01); *H01L 29/78603* (2013.01); *H01L 29/78618* (2013.01)

(58) Field of Classification Search
    CPC ............. H01L 29/1033; H01L 29/7848; H01L 29/66772; H01L 29/66636; H01L 29/78618; H01L 29/78603
    See application file for complete search history.

(56) References Cited

U.S. PATENT DOCUMENTS

| | | | |
|---|---|---|---|
| 9,419,136 B2 * | 8/2016 | Yu | H01L 29/41766 |
| 9,761,546 B2 | 9/2017 | Cheng et al. | |
| 2005/0285193 A1 * | 12/2005 | Lee | H01L 29/66772 |
| | | | 257/347 |
| 2006/0231892 A1 * | 10/2006 | Furukawa | H01L 21/84 |
| | | | 257/347 |
| 2012/0138897 A1 | 6/2012 | Lin et al. | |
| 2014/0084342 A1 * | 3/2014 | Cappellani | H01L 29/0673 |
| | | | 257/192 |

* cited by examiner

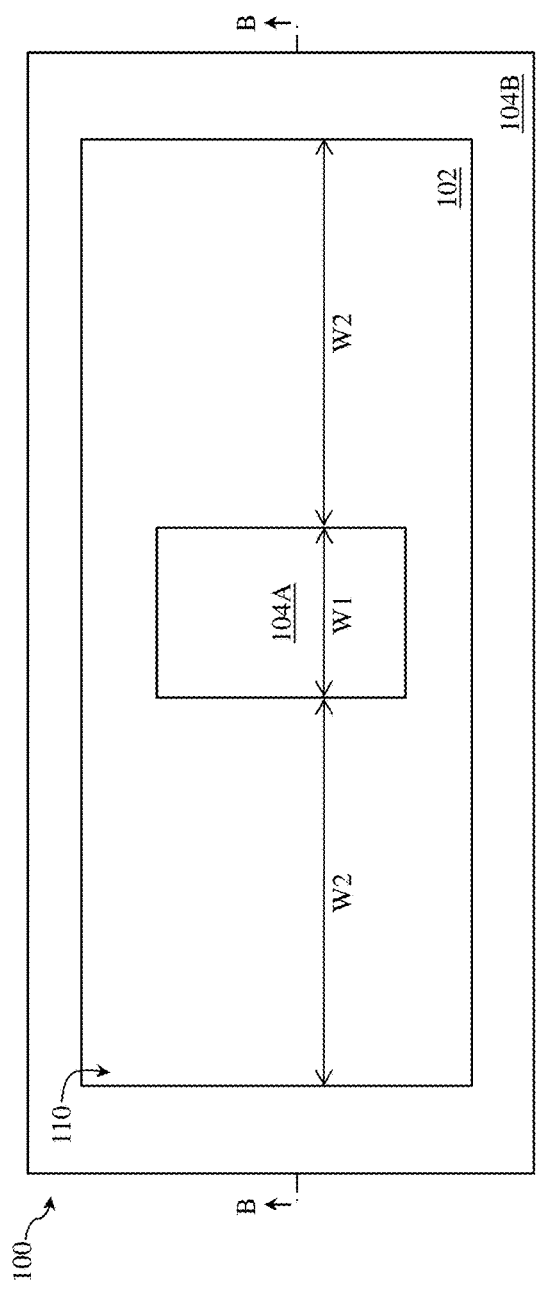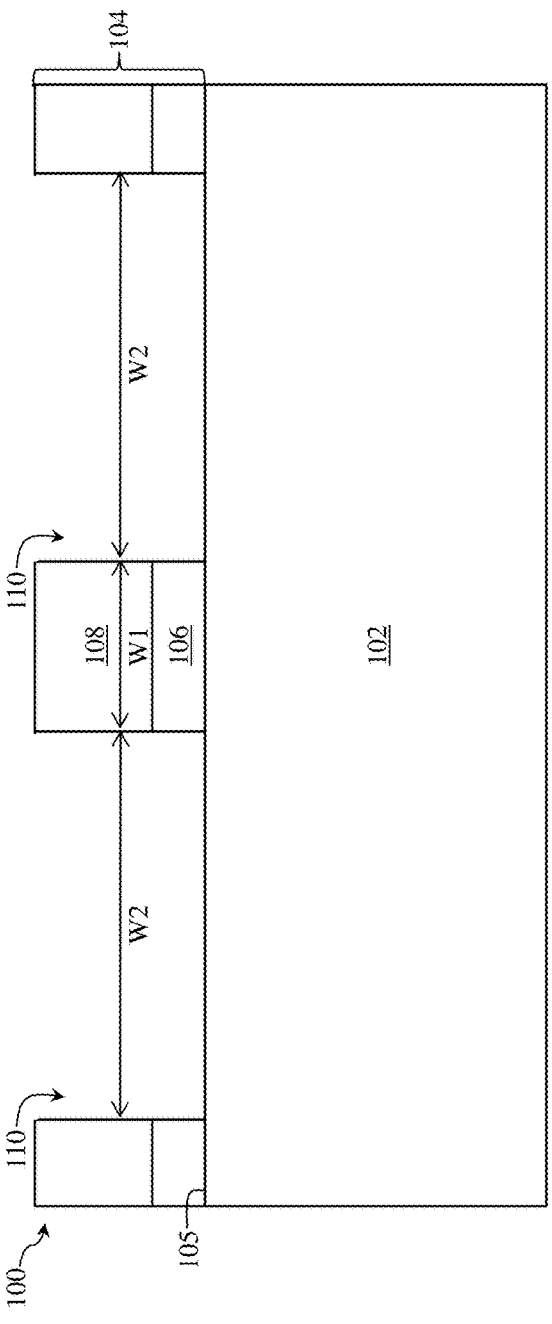
FIG. 2A
FIG. 2B

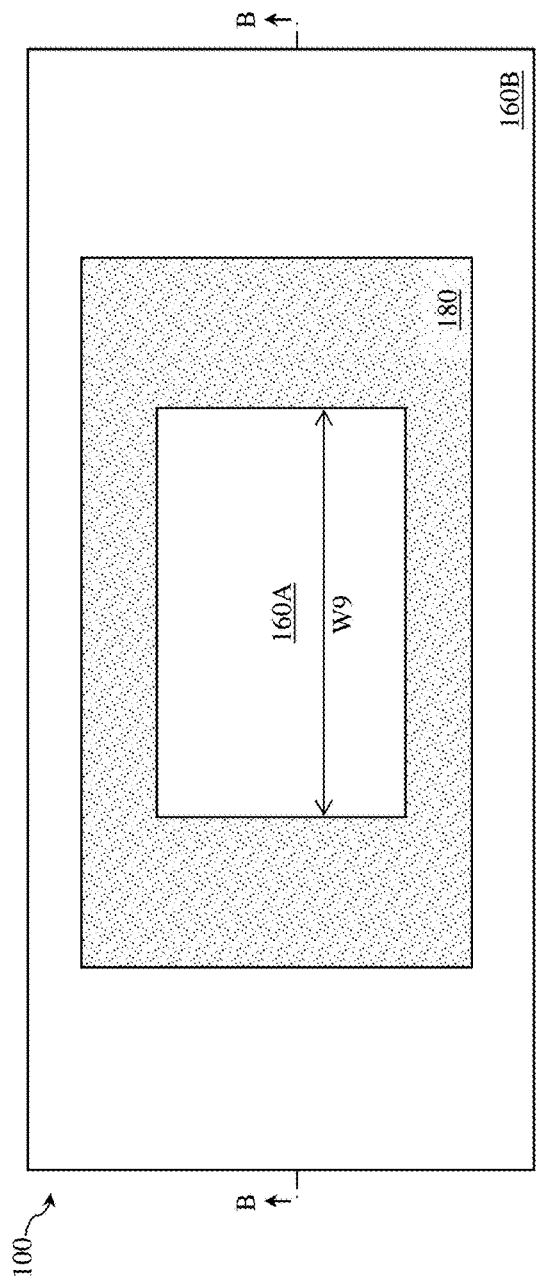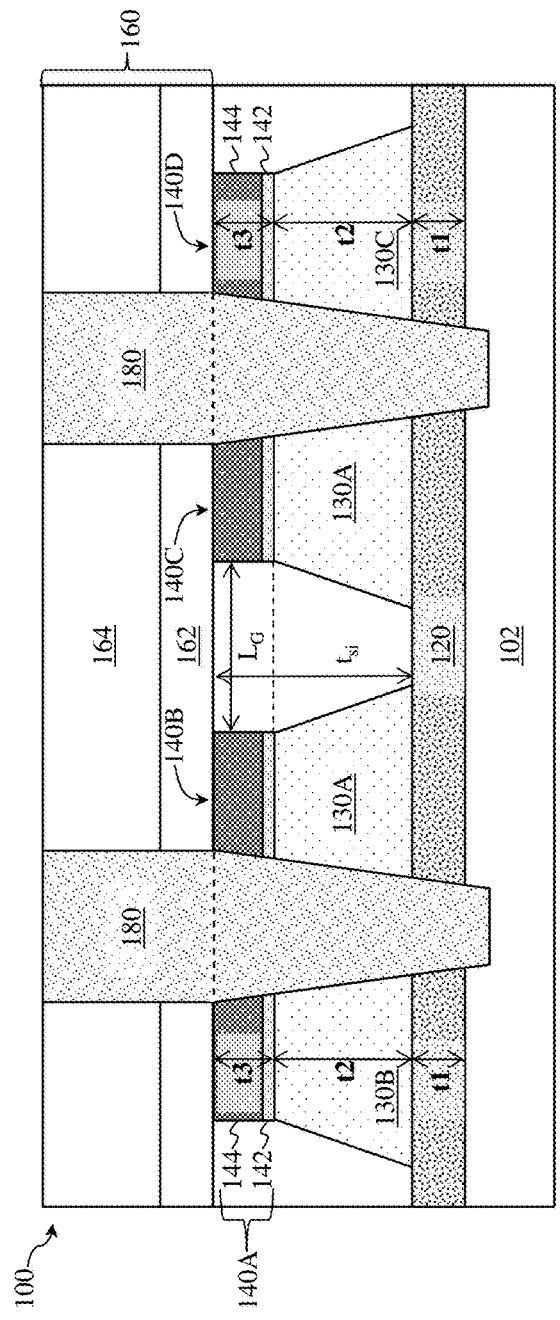
FIG. 12A
FIG. 12B

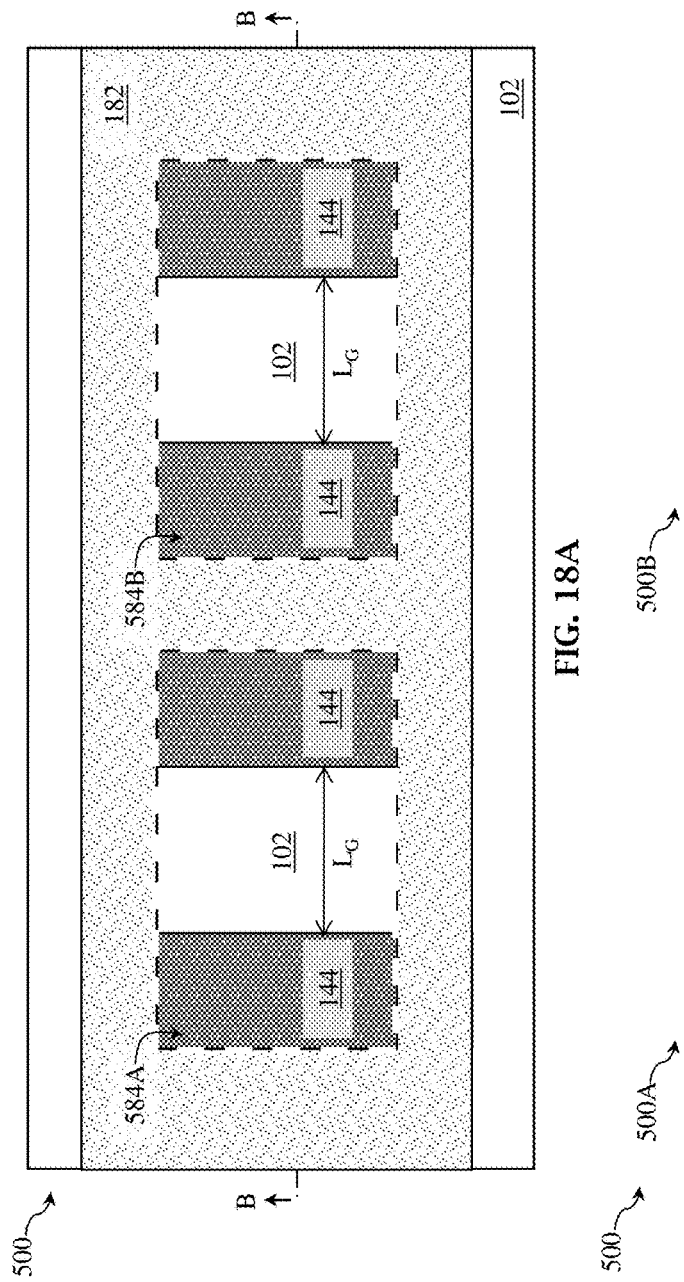
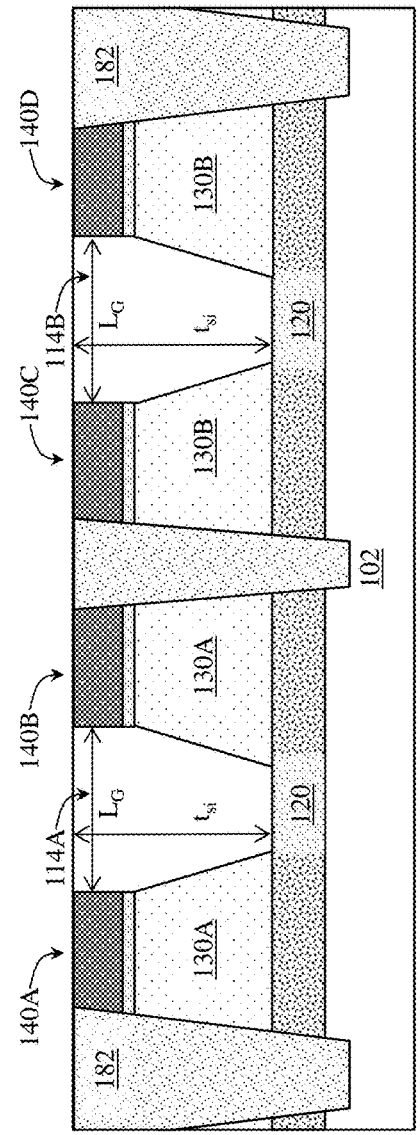
FIG. 18A
FIG. 18B

BULK SEMICONDUCTOR SUBSTRATE CONFIGURED TO EXHIBIT SEMICONDUCTOR-ON-INSULATOR BEHAVIOR

This is a non-provisional application of and claims benefit of U.S. Provisional Patent Application Ser. No. 62/690,545, filed Jun. 27, 2018, which is incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, crosstalk has become a significant challenge as more IC devices, circuits, and/or systems having multiple functionalities are being densely packed into a single substrate to meet demands of advanced IC technology nodes. Often, crosstalk arises from capacitive, inductive, and/or conductive coupling between IC devices and/or IC components on the same substrate. Semiconductor-on-insulator (SOI) technology has been implemented to improve isolation and suppress crosstalk between IC devices and/or IC components. In SOI technology, IC devices are fabricated on a semiconductor-insulator-semiconductor substrate, such as a silicon-oxide-silicon substrate, instead of a bulk semiconductor substrate. However, SOI substrates are very expensive, making high volume manufacturing of IC devices on SOI substrates cost prohibitive. Accordingly, alternative cost-effective approaches are needed for isolating IC devices and/or suppressing crosstalk between IC devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-15A are diagrammatic top views of an IC device, in portion or entirety, at various fabrication stages of a method, such as the method of FIG. 1, according to various aspects of the present disclosure.

FIGS. 2B-15B are diagrammatic cross-sectional views of the IC device, in portion or entirety, respectively along line B-B of FIGS. 2A-15A, according to various aspects of the present disclosure.

FIG. 18A is a diagrammatic top views of an IC device, in portion or entirety, according to various aspects of the present disclosure.

FIG. 18B is a diagrammatic cross-sectional view of the IC device, in portion or entirety, respectively along line B-B of FIG. 18A, according to various aspects of the present disclosure.

DETAILED DESCRIPTION

Figure 1:
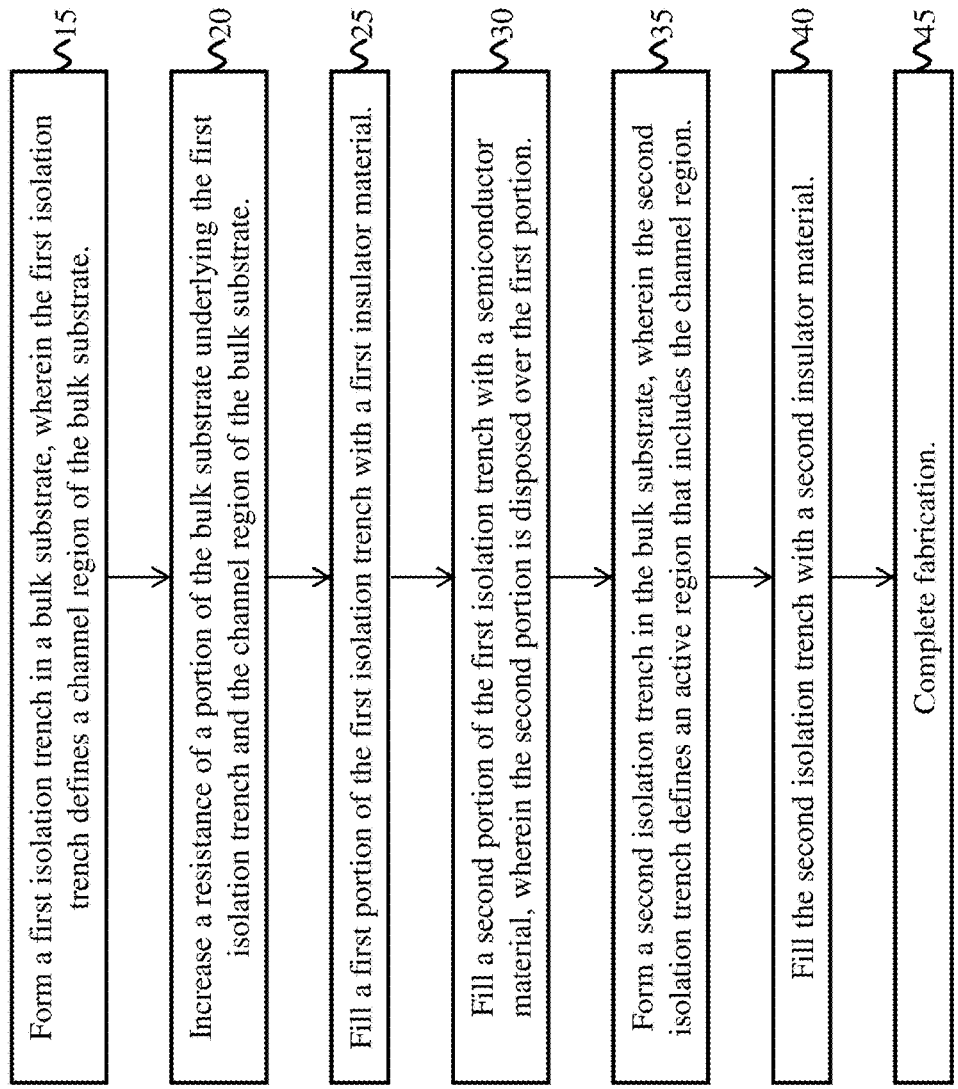
FIG. 1 is a flow chart of a method for fabricating an integrated circuit (IC) device according to various aspects of the present disclosure.

The present disclosure relates generally to integrated circuit (IC) devices, and more particularly, to semiconductor-on-insulator (SOI) like structures that can be fabricated in bulk substrates of IC devices, such that the bulk substrates exhibit SOI-like behavior.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Crosstalk has become a significant challenge as more IC devices, circuits, and/or systems having multiple functionalities are being densely packed into a single substrate to meet demands of advanced IC technology nodes. Crosstalk generally refers to any phenomenon where signals from a first IC device and/or a first IC component pass through the substrate and couple to a second IC device and/or a second IC component, undesirably disrupting or affecting operation of the second IC components and/or the second IC components. Often, crosstalk arises from capacitive, inductive, and/or conductive coupling between the IC devices and/or IC components on the same substrate. Where digital, analog, and radio frequency (RF) (also referred to as microwave) systems are implemented on the same substrate, RF systems have been observed to be extremely sensitive to crosstalk as operating frequencies increase (for example, to GHz ranges) and IC technology nodes shrink.

Semiconductor-on-insulator (SOI) technology has been implemented to improve isolation and suppress crosstalk (noise) between IC devices and/or IC components compared to conventional isolation structures, such as shallow trench isolation (STI) features and/or deep trench isolation (DTI) features, implemented in bulk semiconductor substrates. In SOI technology, IC devices are fabricated on a semiconductor-insulator-semiconductor substrate, such as a silicon-oxide-silicon substrate, instead of a bulk semiconductor substrate. SOI substrates can completely isolate IC devices and/or IC components from one another, significantly reducing any parasitic signals between IC devices and/or IC components on the same substrate. However, SOI substrates are very expensive, oftentimes costing as much as ten times greater than bulk semiconductor substrates. High volume manufacturing of IC devices on SOI substrates is thus often cost prohibitive. High resistivity bulk semiconductor substrates have been introduced as an alternative to SOI substrates, but the high resistivity characteristics of the bulk semiconductor substrate have been observed to create barriers to desired IC performance (for example, by reducing carrier mobility).

The present disclosure proposes alternative approaches for cost-effectively isolating IC devices while significantly suppressing crosstalk and/or improving performance. For example, methods are disclosed herein for fabricating SOI-like structures in bulk semiconductor substrates, such that the bulk semiconductor substrates exhibit SOI behavior (or near-SOI behavior). Each of the SOI-like structures described herein has a dual-isolation structure that defines a substantially (or completely) isolated active region and a substantially (or completely) isolated channel region of an IC device, such as a transistor. For example, the dual-isolation structure includes a first isolation trench that defines a channel region of a bulk substrate and a second isolation trench that defines an active region including the channel region. The first isolation trench can define a desired gate length of the IC device. In some implementations, the channel region has a tapered width that decreases along its thickness, which can minimize (or eliminate) any connection between a bottom portion of the channel region and adjacent IC devices and/or adjacent IC features. The first isolation trench is filled with a first isolation material and a semiconductor material, where the semiconductor material is disposed over the first isolation material. In some implementations, the semiconductor material forms epitaxial source/drain features, which the channel region is disposed between. A second isolation material fills the second isolation trench. A portion of the bulk substrate underlying the first isolation trench and the channel region is configured to have a higher resistance than the bulk substrate. In some implementations, the portion of the bulk substrate underlying the first isolation trench and the channel region is an amorphous layer. The first isolation trench, the second isolation trench, and the higher resistance portion of the bulk substrate can effectively isolate the channel region and source/drain regions of the IC device from adjacent IC devices and/or adjacent IC features, suppressing crosstalk and/or improving IC device performance.

Relatively inexpensive bulk semiconductor substrates implementing the SOI-like structures described herein exhibit SOI-like properties and characteristics, such that IC devices fabricated on the bulk semiconductor substrates exhibit improved performance similar to that observed when fabricated on SOI substrates. The disclosed SOI-structures can thus significantly suppress crosstalk and/or improve IC performance at a fraction of the cost of SOI technology and/or high resistance bulk substrate technology. The SOI-like structures are particularly well-suited for RF applications, providing strong isolation for RF devices, which can significantly improve performance of RF devices. Different embodiments may have different advantages, and no particular advantage is necessarily required of any embodiment.

Turing to FIG. 1, FIG. 1 is a flow chart of a method 10 for fabricating an IC device, such that a bulk substrate of the IC device exhibits SOI behavior, according to various aspects of the present disclosure. At block 15, method 10 includes forming a first isolation trench in the bulk substrate. The first isolation trench defines a channel region of the bulk substrate, and in particular, defines a gate length of the IC device. In some implementations, a two-step etching process is performed to form the first isolation trench, such that the first isolation trench includes a first portion disposed over a second portion. In some implementations, the first portion has substantially vertical sidewalls and the second portion has negatively sloped sidewalls, where the first portion defines the gate length. At block 20, method 10 includes increasing a resistance of a portion of the bulk substrate underlying the first isolation trench and the channel region of the bulk substrate. In some implementations, an implantation process is performed that introduces ions and/or dopants to the portion of the bulk substrate, thereby forming a high resistance layer of the bulk substrate. In some implementations, the high resistance layer is an amorphous layer of the bulk substrate. At block 25, method 10 includes filling the first portion of the first isolation trench with a first insulator material, such as any material suitable for isolation purposes. At block 30, method 10 includes filling the second portion of the first isolation trench with a semiconductor material. In some implementations, the semiconductor material is an epitaxial semiconductor material, which can form epitaxial source/drain features of the IC device. At block 35, method 10 includes forming a second isolation trench in the bulk substrate. The second isolation trench defines an active region that includes the channel region of the bulk substrate. In some implementations, the active region further includes the epitaxial source/drain features. At block 40, method 10 fills the second isolation trench with a second insulator material, such as any material suitable for isolation purposes. In some implementations, the second insulator material is the same as the first insulator material. In some implementations, the second insulator material is different than the first insulator material. At block 45, method 10 can continue to complete fabrication of the IC device. Additional steps can be provided before, during, and after method 10, and some of the steps described can be moved, replaced, or eliminated for additional embodiments of method 10.

FIGS. 2A-15A are diagrammatic top views of an IC device 100, in portion or entirety, at various fabrication stages of a method, such as method 10 of FIG. 1, according to various aspects of the present disclosure. FIGS. 2B-15B are diagrammatic cross-sectional views of IC device 100, in portion or entirety, respectively along line B-B of FIGS. 2A-15A, according to various aspects of the present disclosure. IC device 100 can be included in a microprocessor, a memory, and/or other IC device. In some implementations, IC device 100 is a portion of an IC chip, a system on chip (SoC), or portion thereof, that includes various passive and/or active microelectronic devices such as resistors, capacitors, inductors, diodes, p-type field effect transistors (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as fin-like FETs (FinFETs), depending on design requirements of IC device 100. FIGS. 2A-15A and FIGS. 2B-15B have been simplified for the sake of clarity to better understand the inventive concepts of the present disclosure. Additional features can be added in IC device 100, and some of the features described below can be replaced, modified, or eliminated in other embodiments of IC device 100.

Turning to FIG. 2A and FIG. 2B, IC device 100 includes a bulk substrate (wafer) 102. In the depicted embodiment, bulk substrate 102 includes silicon, which can be referred to generally as a bulk silicon substrate. Alternatively or additionally, bulk substrate 102 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AnnAs, AlGaAs, GaInAs, GaInP, and/or GaInAsP; or combinations thereof. In some implementations, bulk substrate 102 includes one or more group III-V materials, one or more group II-IV materials, or combinations thereof. Bulk substrate 102 can include various doped regions (not shown) configured according to design requirements of IC device 100. In some implementations, bulk substrate 102 includes p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, bulk substrate 102 includes doped regions formed with a combination of p-type dopants and n-type dopants. The various doped regions can be formed directly on and/or in bulk substrate 102, for example, providing a p-well structure, an n-well structure, a dual-well structure, a raised structure, or combinations thereof. An ion implantation process, a diffusion process, and/or other suitable doping process can be performed to form the various doped regions.

A patterning layer 104 is formed over bulk substrate 102, particularly over a top surface 105 of bulk substrate 102. Patterning layer 104 includes a material that is different than a material of bulk substrate 102 to achieve etching selectivity during subsequent etching processes. In the depicted embodiment, patterning layer 104 has a multilayer structure. For example, patterning layer 104 includes a mask barrier layer 106 disposed over top surface 105 of bulk substrate 102, and a mask layer 108 disposed over mask barrier layer 106. Mask barrier layer 106 includes a material with high etch resistance that achieves desired etching selectivity (for example, between mask barrier layer 106 and mask layer 108), such as a material including titanium and nitrogen (for example, titanium nitride), and mask layer 108 includes a material that achieves desired etching selectivity (for example, between mask layer 108 and bulk substrate 102), such as a dielectric material that includes silicon and nitrogen (for example, silicon nitride). In some implementations, patterning layer 104 includes silicon, amorphous silicon, oxygen, nitrogen, carbon, other suitable patterning layer constituent, or combinations thereof (for example, silicon oxide, silicon nitride, silicon oxynitride, and/or silicon carbide). In some implementations, patterning layer 104 includes a resist layer (also referred to as a photoresist layer) including a suitable resist material. Patterning layer 104 is formed by any suitable deposition process. For example, mask barrier layer 106 and/or mask layer 108 are formed over bulk substrate 102 by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable method, or combinations thereof.

Patterning layer 104 includes an opening 110 that defines an isolation region and a channel region of IC device 100 (generally referred to as an isolation region pattern), where the isolation region pattern further defines a desired gate length ($L_G$) of a transistor of IC device 100. In the depicted embodiment, opening 110 divides patterning layer 104 into a portion 104A and a portion 104B. Portion 104A defines an inner perimeter of the isolation region and the channel region of the IC device 100. A width W1 of portion 104A extends along a gate length direction of IC device 100, where width W1 is substantially equal to the desired gate length of the transistor (in other words, W1≈$L_G$). Portion 104B defines an outer perimeter of the isolation region, where portions of opening 110 defined along the gate length direction between portion 104A and portion 104B have a width W2. Opening 110 is formed by performing a lithography process to form a patterned resist layer over mask layer 108 and performing an etching process to transfer a pattern defined in the patterned resist layer to mask layer 108. The lithography process can include forming a resist layer on mask layer 108 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of mask layer 108 and/or mask barrier layer 106. The etching process can include a dry etching process, a wet etching process, other suitable etching process, or combinations thereof. The patterned resist layer is then removed from mask layer 108, for example, by a resist stripping process. In some implementations, the patterned resist layer is used as an etch mask to remove portions of mask layer 108 and mask barrier layer 106. In some implementations, the patterned resist layer is used as an etch mask to remove portions of mask layer 108, and mask layer 108 is used as an etching mask to remove portions of mask barrier layer 106 (in some implementations, after removing the patterned resist layer). Alternatively, the exposure process can be implemented or replaced by other methods utilizing maskless lithography, electron-beam lithography, ion-beam lithography, and/or nanoimprint technology.

Figure 3A:
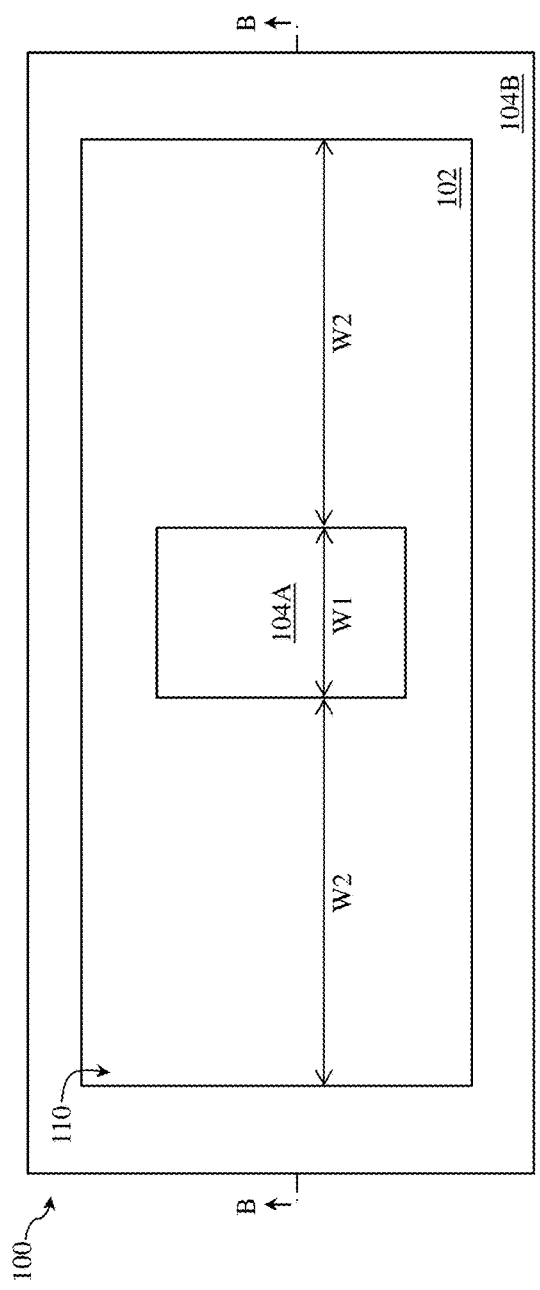
Figure 3B:
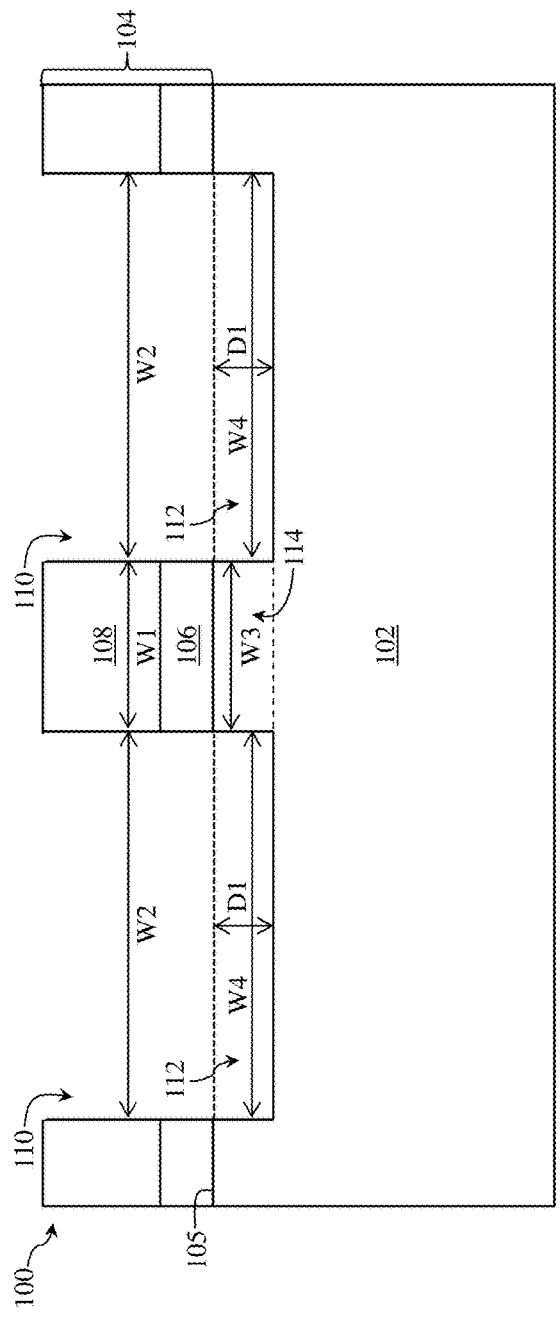

A two-step etching process is then performed using patterning layer 104 as a mask to form an isolation trench that defines a channel region of bulk substrate 102. Turning to FIG. 3A and FIG. 3B, a first etching process removes portions of bulk substrate 102 exposed by opening 110, thereby defining an isolation trench 112 having a depth D1 in bulk substrate 102, where isolation trench 112 defines a channel region 114 of bulk substrate 102. In some implementations, depth D1 is about 50 nm to about 200 nm. The first etching process is configured to etch substantially in one direction (for example, vertical) to achieve substantially vertical sidewalls for isolation trench 112. A width W3 of channel region 114 is thus substantially equal to width W1 of portion 104A of patterning layer 104, and thus substantially equal to the desired gate length of the transistor of IC device 100 (in other words, $W3 \approx W1 \approx L_G$). In some implementations, the first etching process is an anisotropic etching process. In the depicted embodiment, channel region 114 is defined between portions of isolation trench 112 that correspond with portions of opening 110 disposed between portion 104A and portion 104B along the gate length direction. For ease of discussion, these portions of isolation trench 112 may be referred to herein as a first isolation trench and a second isolation trench. A width W4 of the portions of isolation trench 112 along the gate length direction (here, the first isolation trench and the second isolation trench) are substantially equal to width W2 of the portions of opening 110 defined along the gate length direction between portion 104A and portion 104B (in other words, $W4 \approx W2$). In some implementations, the first etching process is a dry etching process, a wet etching process, other suitable etching process, or combination thereof.

Figure 4A:
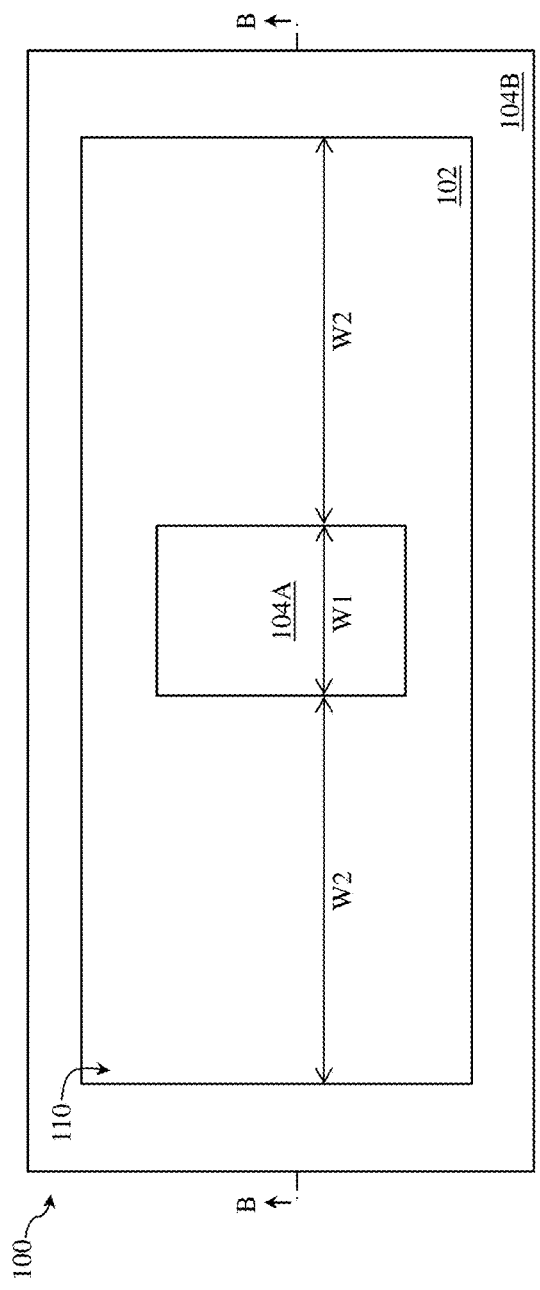
Figure 4B:
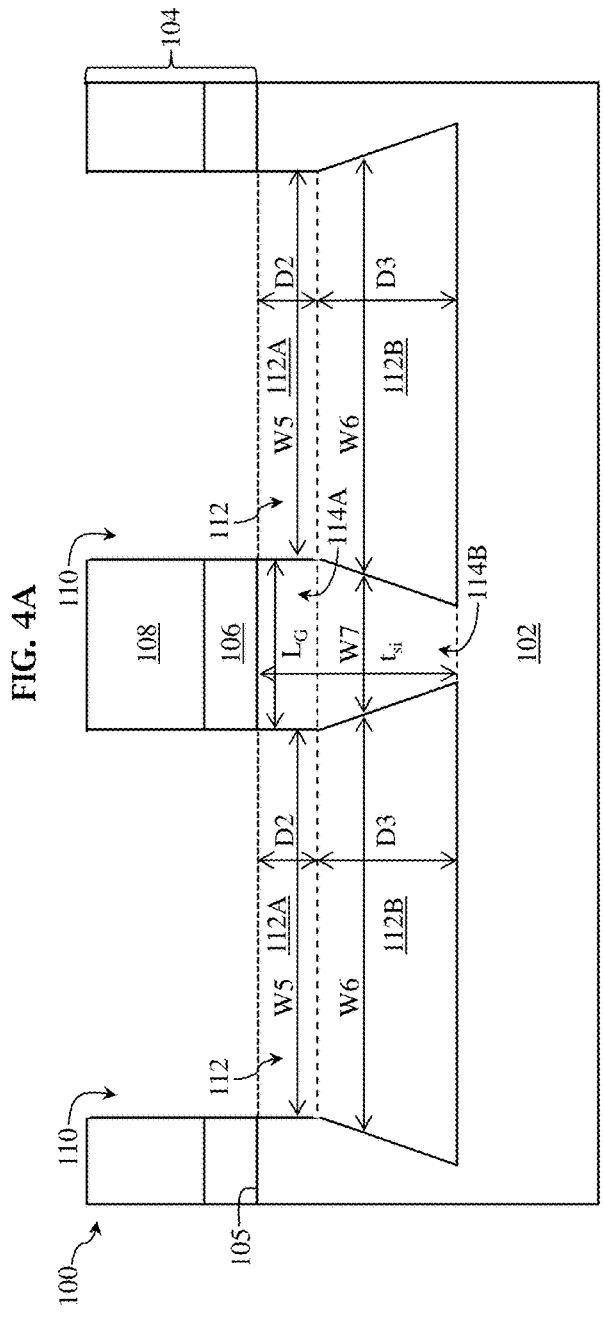

Turning to FIG. 4A and FIG. 4B, a second etching process removes portions of bulk substrate 102 exposed by opening 110 to extend isolation trench 112, thereby extending channel region 114 of bulk substrate 102. The second etching process is configured to etch in more than one direction (for example, vertical and horizontal) to achieve a width of isolation trench 112 that increases as the depth of isolation trench 112 increases. The width of isolation trench 112 thus increases in a direction toward a bottom surface of isolation trench 112. The second etching process includes dry etching processes, wet etching processes, or combinations thereof. In some implementations, the second etching process is an isotropic etching process. After the second etching process, isolation trench 112 has an isolation trench portion 112A having depth D2 that defines channel region portion 114A and an isolation trench portion 112B having a depth D3 that defines channel region portion 114B. In the depicted embodiment, depth D3 is greater than depth D2, though the present disclosure contemplates various configurations of depth D2 and depth D3. In some implementations, depth D2 is substantially equal to depth D1 (in other words, $D2 \approx D1$). In some implementations, depth D2 is about 50 nm to about 200 nm, and depth D3 is about 50 nm to about 200 nm. In some implementations, a total depth of isolation trench 112 is substantially equal to a desired thickness ($t_{si}$) of channel region 114 (in other words, $t_{si}=D2+D3=$total depth of isolation trench 112).

Isolation trench portion 112A has substantially vertical sidewalls and isolation trench portion 112B has substantially negatively sloped sidewalls. In other words, sidewalls of isolation trench portion 112A form an angle substantially equal to about 90° (a right angle) relative to top surface 105 of bulk substrate 102, and sidewalls of isolation trench portion 112B form an angle greater than about 90° (an obtuse angle) relative to top surface 105 of bulk substrate 102. This results in isolation trench portion 112A having a width W5 that is substantially the same as depth D2 increases (which, in the depicted embodiment, is substantially equal to width W4 (in other words, $W5 \approx W4 \approx W2$)) and isolation trench portion 112B having a width W6 that increases as depth D3 increases. Isolation trench portion 112B thus has a tapered width, where a width of a top portion of isolation trench portion 112B (proximate to isolation trench portion 112A) is less than a width of a bottom portion of isolation trench portion 112B. Accordingly, a shape of channel region 114 is defined by a shape of isolation trench 112, such that a width of a top surface of channel region 114 (here, a top surface of channel region 114A) is greater than a width of a bottom surface of channel region 114 (here, a bottom surface of channel region 114B). In the depicted embodiment, a width of channel region 114A (here, $L_G$) remains substantially the same along thickness $t_{si}$ of channel region 114, while channel region portion 114B has a tapered width along thickness $t_{si}$ of channel region 114. For example, a width W7 of channel region portion 114B decreases as thickness $t_{si}$ increases.

Figure 5A:
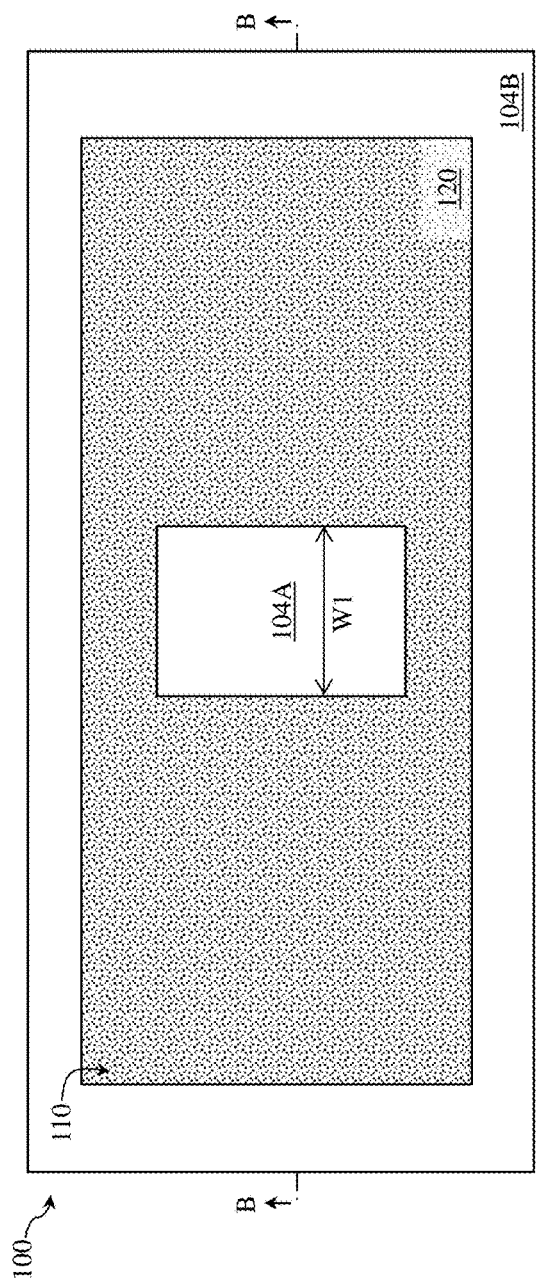
Figure 5B:
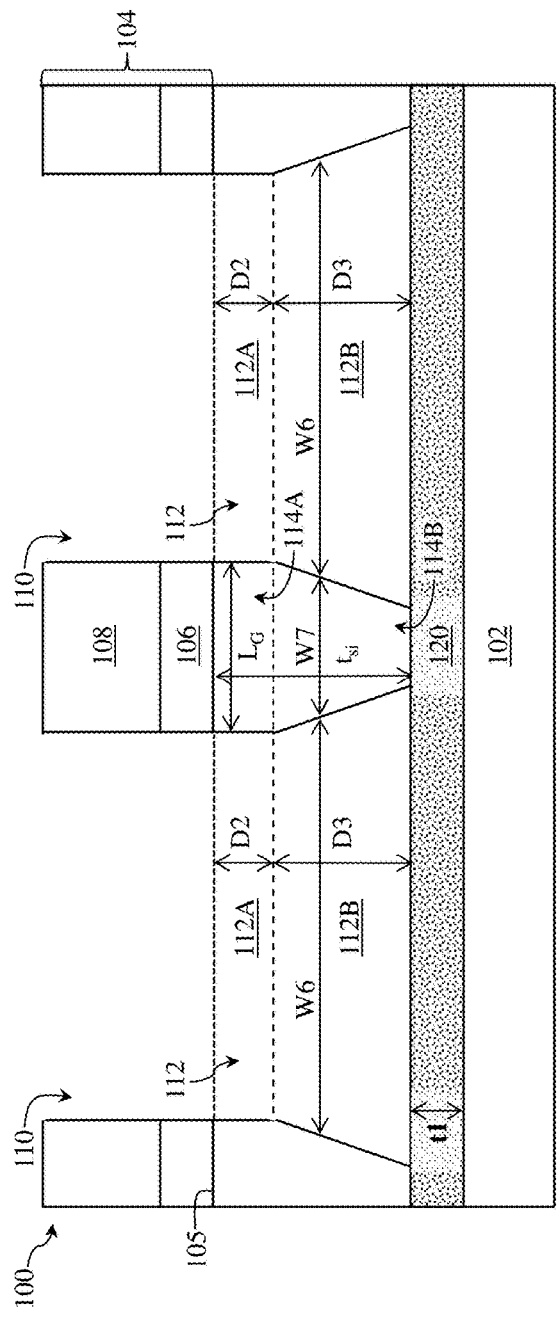

Turning to FIG. 5A and FIG. 5B, a process is performed to increase a resistance of a portion of bulk substrate 102 underlying isolation trench 112 and channel region 114. For example, an implantation process is performed to form a high resistance layer 120 of bulk substrate 102 underlying isolation trench 112 and channel region 114, such that a bottom surface of isolation trench 112 and a bottom surface of channel region 114 are defined by high resistance layer 120 having a thickness t1. In some implementations, thickness t1 is about 20 nm to about 100 nm. An ohmic resistance of high resistance layer 120 is greater than an ohmic resistance of bulk substrate 102. In some implementations, bulk substrate 102 is a low resistance substrate exhibiting, for example, an ohmic resistance of about several ohm-cm (Ω-cm) to about several hundreds of ohm-cm, whereas high resistance layer 120 exhibits an ohmic resistance of about several hundreds of ohm-cm to about several thousands of ohm-cm. In some implementations, an ohmic resistance of bulk substrate 102 is less than or equal to about 750 Ω-cm and an ohmic resistance of high resistance layer 120 is greater than about 750 Ω-cm. In some implementations, the implantation process is performed at a tilt angle to ensure that the portion of bulk substrate 102 underlying channel region 114 (which is covered by portion 104A of patterning layer 104) is modified to in a manner that increases ohmic resistance of high resistance layer 120 relative to bulk substrate 102. In some implementations, the tilt angle is configured to ensure that high resistance layer 120 extends continuously between exposed portions (in opening 110) and non-exposed portions of bulk substrate 102 (covered by portion 104A and portion 104B of patterning layer 104.

In some implementations, the implantation process bombards bulk substrate 102 with ions that can change a structure of bulk substrate 102, such as argon (Ar) ions, xenon (Xe) ions, other suitable ions, or combinations thereof. For example, where bulk substrate 102 includes a material having an ordered atomic structure (often referred to as a crystalline structure), the implantation process can utilize xenon ions to change an atomic structure of bulk substrate 102, such that high resistance layer 120 is a portion of bulk substrate 120 having a non-crystalline structure (in other words, a material having a disordered atomic structure). In the depicted embodiment, where bulk substrate 102 includes silicon in a crystalline structure, high resistance layer 120 includes silicon in a non-crystalline structure, such as amorphous silicon. In such implementations, high resistance layer 120 may be referred to as an amorphous silicon layer. In some implementations, the implantation process introduces dopants into bulk substrate 102 to increase a resistance of high resistance layer 120 relative to bulk substrate 102. In such implementations, high resistance layer 120 includes n-type dopants (for example, arsenic, phosphorus, other n-type dopant, or combinations thereof), p-type dopants (for example, boron, germanium, indium, other p-type dopant, or combinations thereof), or combinations thereof. In such implementations, where bulk substrate 102 includes silicon, high resistance layer 120 includes doped silicon. It is noted that, in implementations where bulk substrate 102 includes a dopant, a dopant concentration of high resistance layer 120 is greater than a dopant concentration of bulk substrate 102. In some implementations, the implantation process includes bombarding bulk substrate 102 with ions to change its atomic structure and introducing dopants into bulk substrate 102. In some implementations, any other suitable process can be performed to increase a resistance of the portion of bulk substrate 102 underlying isolation trench 112 and channel region 114, thereby forming high resistance layer 120.

Figure 6A:
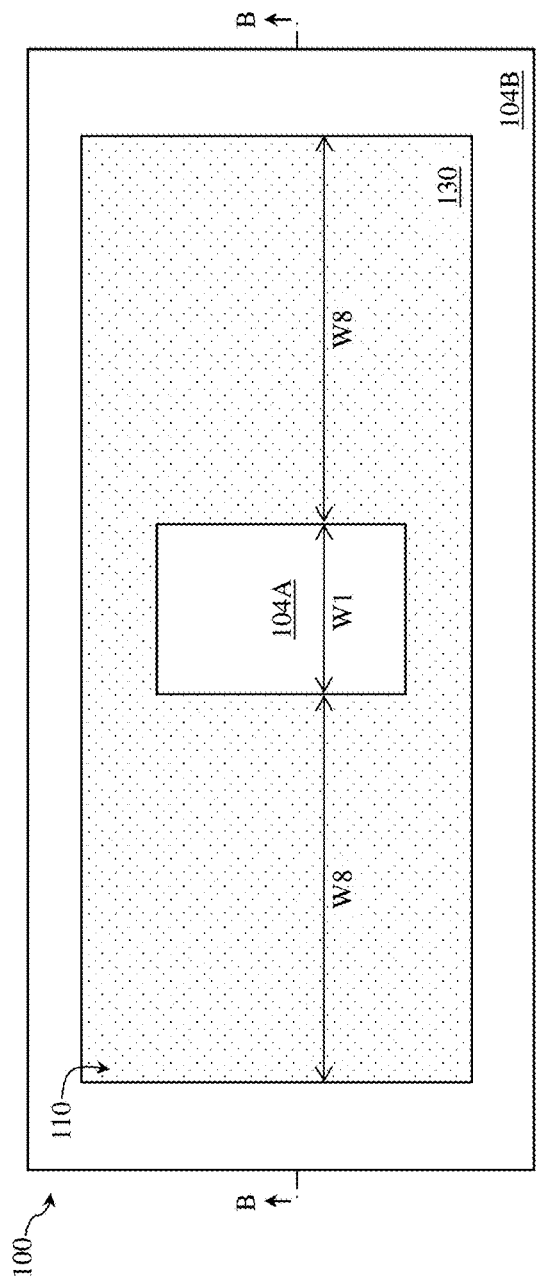
Figure 6B:
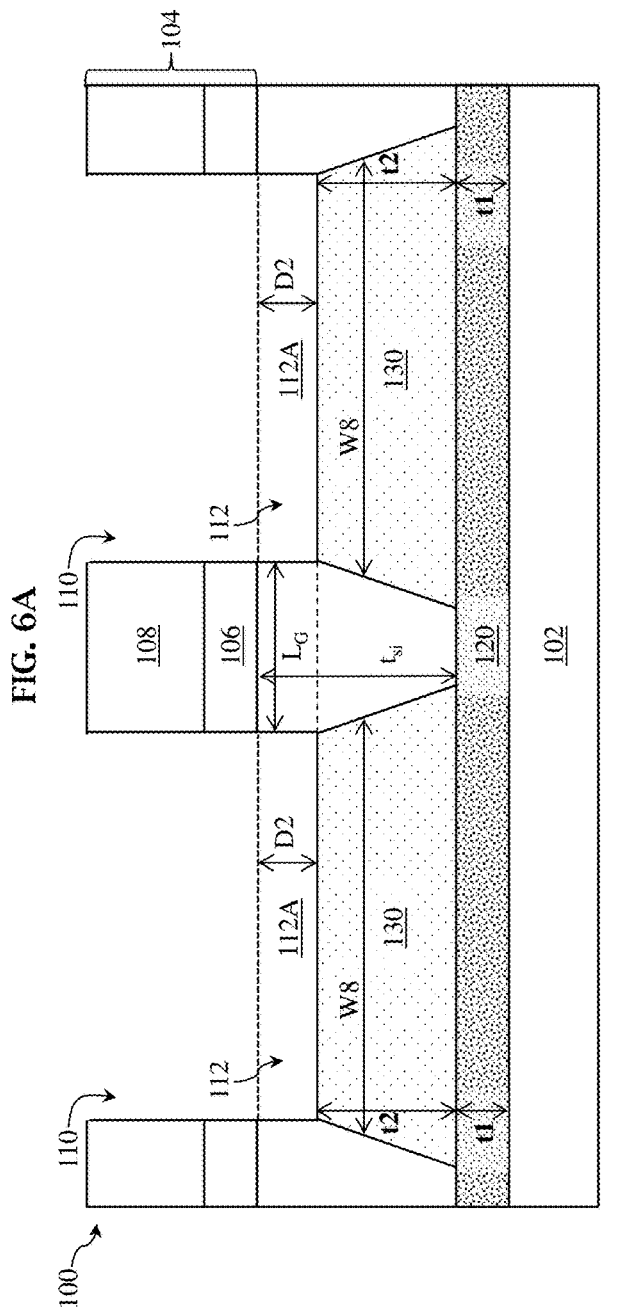

Turning to FIG. 6A and FIG. 6B, an isolation feature 130 having a thickness t2 is formed on high resistance layer 120 by filling isolation trench portion 112B with an isolation material. Isolation trench 112 is thus partially filled by forming isolation feature 130. Thickness t2 is substantially equal to depth D3 of isolation trench portion 112B (in other words, t2 D3). In some implementations, thickness t2 is about 50 nm to about 200 nm. Isolation feature 130 has a tapered width, where a width of a top portion of isolation feature 130 is less than a width of a bottom portion of isolation feature 130. For example, isolation feature 130 has a width W8 that increases as thickness t2 increases. In the depicted embodiment, width W8 is substantially equal to width W6 of isolation trench portion 112B (in other words, W8 W6). The isolation material includes silicon, oxygen, nitrogen, carbon, other suitable isolation constituent, or combinations thereof (for example, silicon oxide, silicon nitride, and/or silicon oxynitride). Isolation feature 130 can be formed by depositing an isolation material that completely or partially fills isolation trench 112 (in some implementations, the isolation material is also disposed over patterning layer 104) and etching back the isolation material, such that the isolation material remains only in isolation trench portion 112B. For example, a high density plasma CVD (HDP-CVD) process completely or partially fills isolation trench 112 with an oxide material and an HDP oxide etch back process (for example, a wet etching process) removes a portion of the oxide material (for example, from isolation trench portion 112A), such that the oxide material fills isolation trench portion 112B. In such implementations, isolation feature 130 can be referred to as an HDP-CVD oxide layer. In some implementations, a minimal amount of isolation material remains in isolation trench portion 112A, such that isolation feature 130 partially fills isolation trench portion 112A. In some implementations, the isolation material is deposited by CVD, PVD, ALD, a spin-on glass process, other suitable process, or combinations thereof. In some implementations, the isolation material is deposited by a flowable CVD (FCVD) process that includes, for example, depositing a flowable material (such as a liquid compound) in isolation trench 112 and converting the flowable material to a solid material by a suitable technique, such as thermal annealing and/or UV radiation treating. In some implementations, isolation feature 130 includes a multilayer structure, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 130 includes a dielectric layer disposed over a doped liner layer (including, for example, boron silicate glass (BSG) or phosphosilicate glass (PSG)).

Figure 7A:
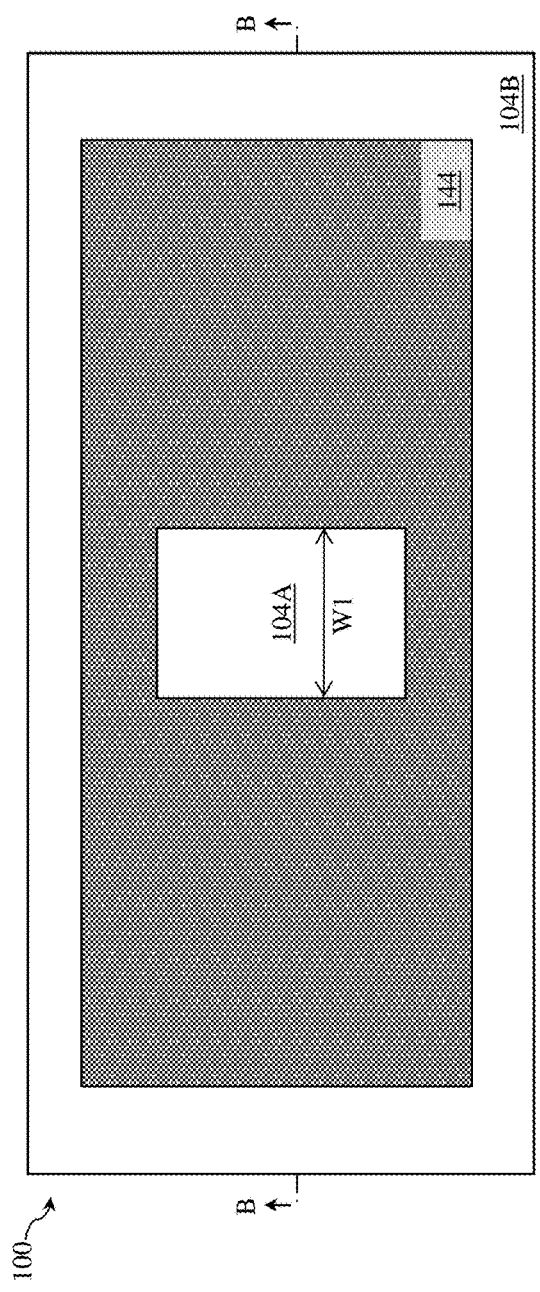
Figure 7B:
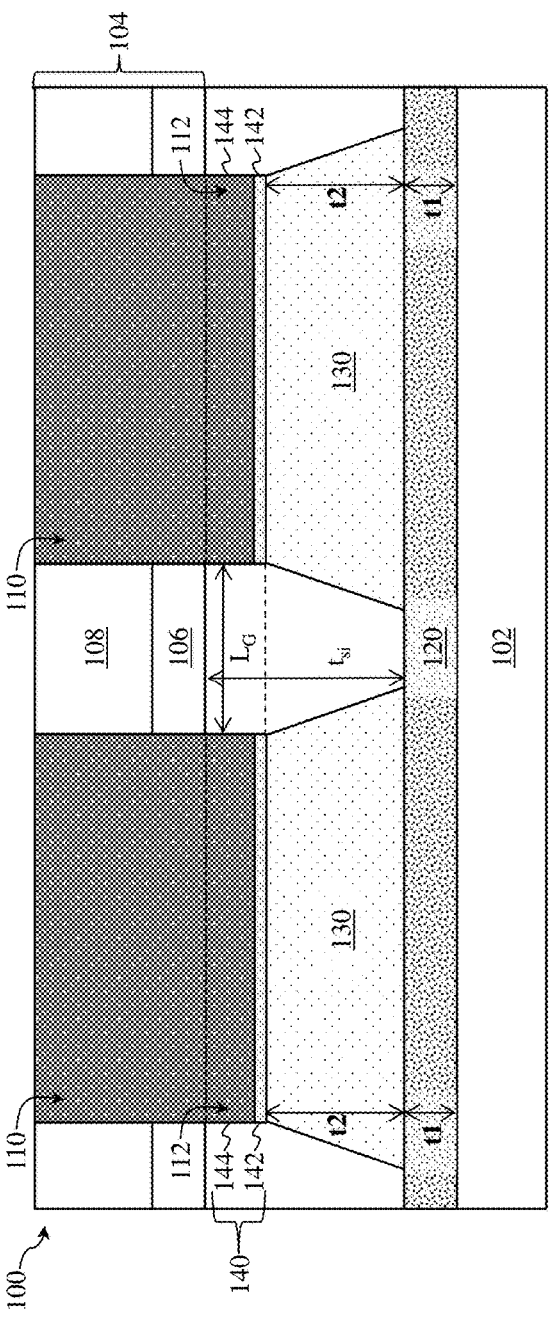

Epitaxial source features and epitaxial drain features (generally referred to as an epitaxial source/drain feature 140) are then formed on isolation feature 130, filling any remaining portion of isolation trench 112. Turning to FIG. 7A and FIG. 7B, semiconductor material is epitaxially grown on isolation feature 130, forming epitaxial source/drain feature 140. In the depicted embodiment, epitaxial source/drain feature 140 includes an epitaxial seed layer 142 and an epitaxial layer 144 that combine to completely fill isolation trench portion 112A and opening 110 in patterning layer 104. Epitaxial seed layer 142 includes any material that can facilitate growth of epitaxial layer 144. In some implementations, epitaxial layer 144 partially fills opening 110. An epitaxy process for forming epitaxial seed layer 142 and/or epitaxial layer 144 can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors. For example, in the depicted embodiment, where epitaxial seed layer 142 and epitaxial bulk layer 144 are silicon-containing epitaxial layers, the epitaxy process can use a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gas, or combinations thereof. The epitaxy process can further use a carrier gas including helium, nitrogen, hydrogen, argon, other suitable carrier gas, or combinations thereof. In some implementations, where epitaxial seed layer 142 and/or epitaxial bulk layer 144 further include germanium, the epitaxy process can use a germanium-containing precursor gas, such as germane ($GeH_4$), digermane ($Ge_2H_6$), germanium tetrachloride ($GeCl_4$), germanium dichloride ($GeCl_2$), other suitable germanium-containing precursor gas, or combinations thereof. In some implementations, epitaxial source/drain feature 140 is doped with n-type dopants and/or p-type dopants. For example, epitaxial seed layer 142 and/or epitaxial layer 144 are silicon-containing epitaxial layers or silicon-carbon-containing epitaxial layers doped with phosphorous, arsenic, other n-type dopant, or combinations thereof (for example, forming a Si:P epitaixal source/drain feature or a Si:C:P epitaxial source/drain feature). In another example, epitaxial seed layer 142 and/or epitaxial layer 144 are silicon-and-germanium-containing epitaxial layers doped with boron, carbon, other p-type dopant, or combinations thereof (for example, forming a Si:Ge:B epitaxial source/drain feature). In some implementations, epitaxial source/drain feature 140 includes materials and/or dopants that achieve desired tensile stress and/or compressive stress in channel region 114 of bulk substrate 102. In some implementations, epitaxial source/drain feature 140 is doped during deposition by adding impurities to a source material of the epitaxy process.

In some implementations, epitaxial source/drain feature 140 is doped by an ion implantation process performed after a deposition process.

Figure 8A:
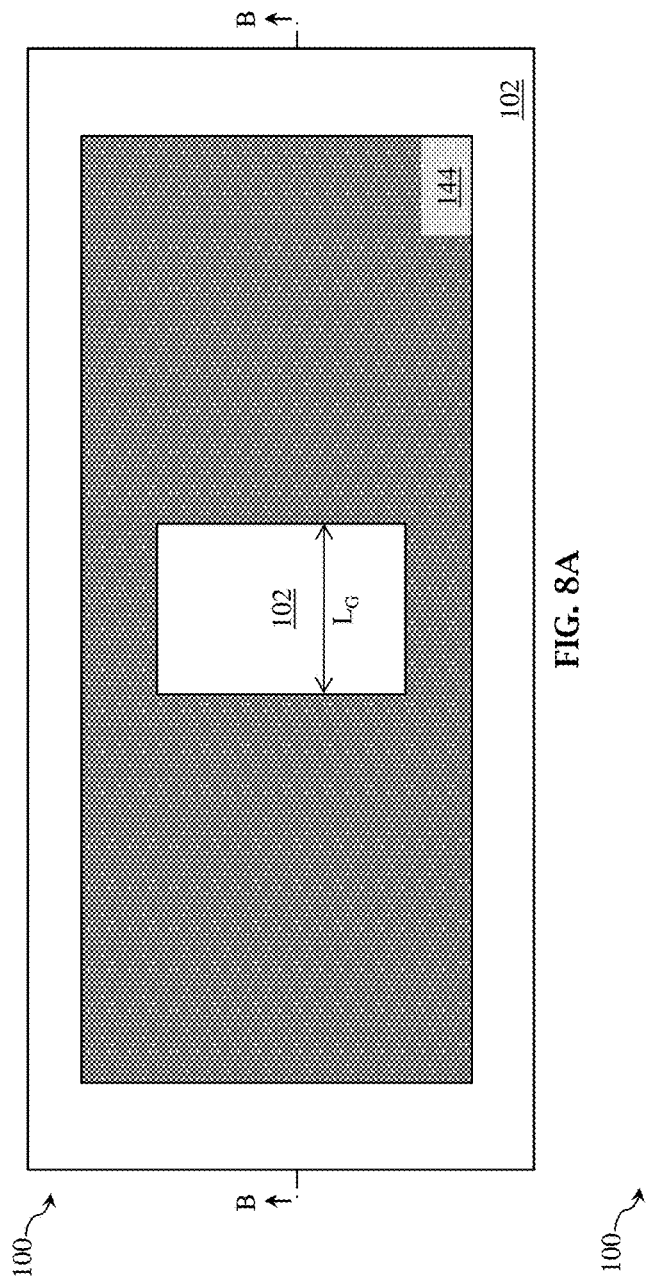
Figure 8B:
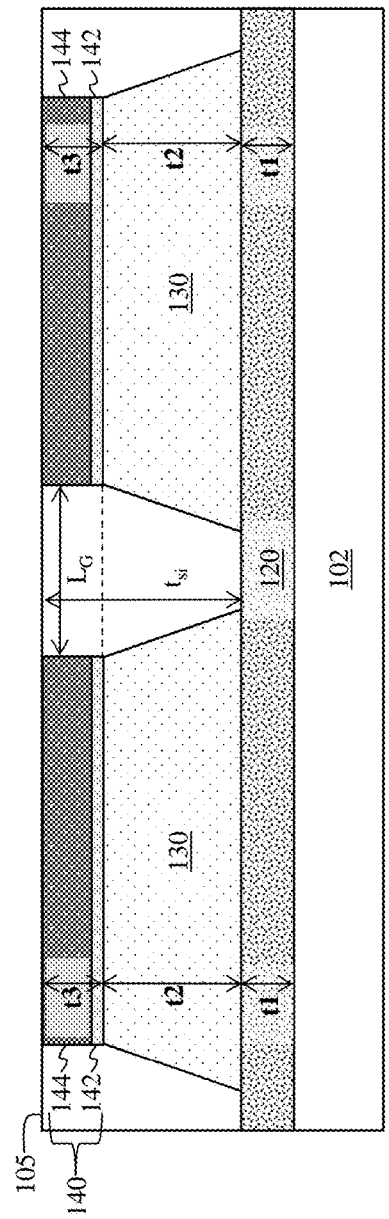

Turning to FIG. 8A and FIG. 8B, a process is performed to reduce a thickness of epitaxial source/drain feature 140, such that epitaxial source/drain feature 140 has a thickness t3. Thickness t3 is substantially equal to depth D2 of isolation trench portion 112A (in other words, t3≈D2). Epitaxial source/drain feature 140 thus fills isolation trench portion 112A. In some implementations, thickness t3 is about 50 nm to about 200 nm. In some implementations, an etch back process, such as a wet etching process, is performed until reaching top surface 105 of bulk substrate 102. In some implementations, a CMP process is performed until reaching top surface 105 of bulk substrate 102. In some implementations, an etch back process and a CMP process is performed. In some implementations, the etch back process utilizes a dry etching process. In the depicted embodiment, IC device 100 has a substantially planar surface after reducing the thickness of epitaxial source/drain feature 140, such that top surface 105 of bulk substrate 102 is substantially planar with a top surface of epitaxial source/drain feature 140. The present disclosure contemplates alternative implementations where a portion of epitaxial source/drain feature 140 remains extending above top surface 105 of bulk substrate 102, such that epitaxial source/drain feature 140 is a raised epitaxial source/drain feature.

Figure 9A:
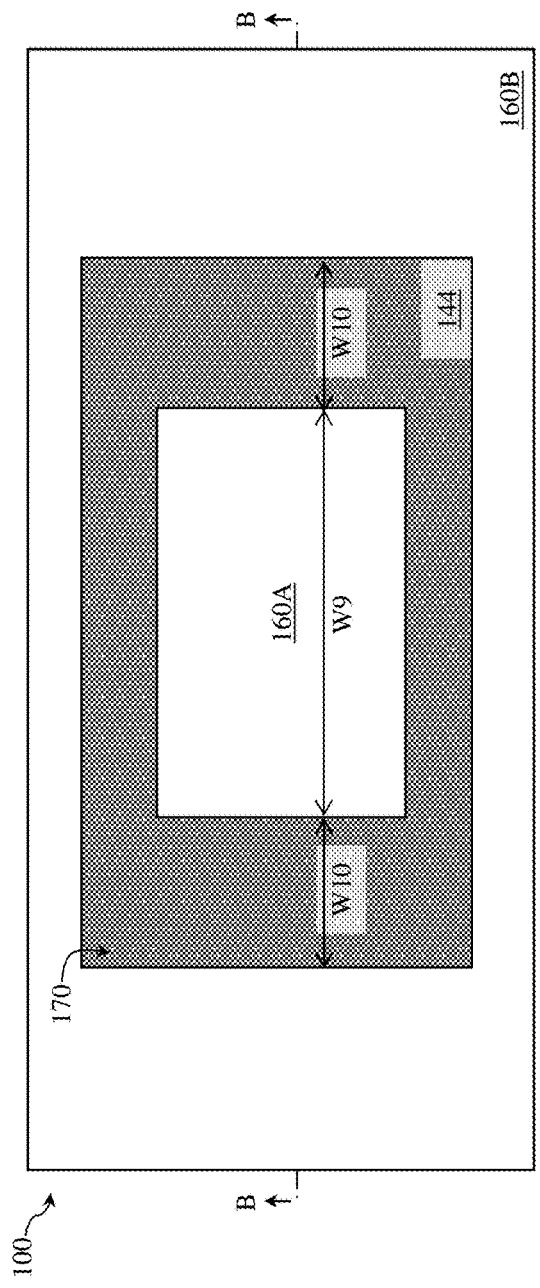
Figure 9B:
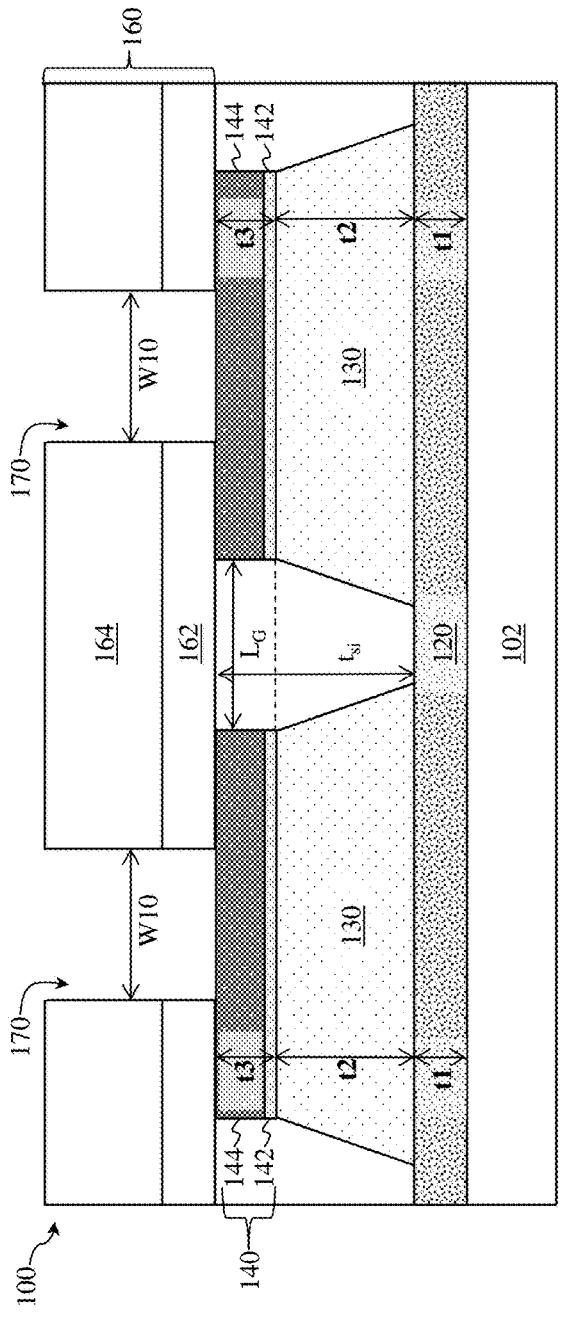

Turning to FIG. 9A and FIG. 9B, a patterning layer 160 is formed over IC device 100, particularly over bulk substrate 102 and epitaxial source/drain feature 140. Patterning layer 160 includes a material that is different than a material of epitaxial source/drain feature 140 to achieve etching selectivity during subsequent etching processes. In the depicted embodiment, patterning layer 160 has a multilayer structure. For example, patterning layer 160 includes a mask barrier layer 162 disposed over top surface 105 of bulk substrate 102 and a top surface of epitaxial source/drain feature 140, and a mask layer 164 disposed over mask barrier layer 162. Mask barrier layer 162 includes a material with high etch resistance that achieves desired etching selectivity (for example, between mask barrier layer 162 and mask layer 164), such as a material including titanium and nitrogen (for example, titanium nitride), and mask layer 164 includes a material that achieves desired etching selectivity (for example, between mask layer 164 and epitaxial source/drain feature 140), such as a dielectric material that includes silicon and nitrogen (for example, silicon nitride). In some implementations, patterning layer 160 includes silicon, amorphous silicon, oxygen, nitrogen, carbon, other suitable patterning layer constituent, or combinations thereof (for example, silicon oxide, silicon nitride, silicon oxynitride, and/or silicon carbide). In some implementations, patterning layer 160 includes a resist layer (also referred to as a photoresist layer) including a suitable resist material. Patterning layer 160 is formed by any suitable deposition process. For example, mask barrier layer 162 and/or mask layer 164 are formed by CVD, PVD, ALD, HDPCVD, MOCVD, RPCVD, PECVD, LPCVD, ALCVD, APCVD, plating, other suitable method, or combinations thereof.

Patterning layer 160 includes an opening 170 that defines another isolation region of IC device 100 (generally referred to as an isolation region pattern), where the isolation region pattern further defines a device region, such as an active region of the transistor of IC device 100. In the depicted embodiment, opening 170 divides patterning layer 160 into a portion 160A and a portion 160B. Portion 160A defines an inner perimeter of the isolation region and the active region of the transistor. A width W9 of portion 160A extends along the gate length direction of IC device 100, where width W9 is substantially equal to a desired length of an active region of the transistor. Portion 160B defines an outer perimeter of the isolation region, where portions of opening 170 defined along the gate length direction between portion 160A and portion 160B have a width W10. In the depicted embodiment, width W10 is less than width W2 corresponding with a width of opening 110 defined along the gate length direction between portion 104A and portion 104B of patterning layer 104. Opening 170 is formed by performing a lithography process to form a patterned resist layer (not shown) over mask layer 164 and performing an etching process to transfer a pattern defined in the patterned resist layer to mask layer 164. The lithography process can include forming a resist layer on mask layer 164 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of mask layer 164 and/or mask barrier layer 162. The etching process can include a dry etching process, a wet etching process, other suitable etching process, or combinations thereof. The patterned resist layer is then removed from mask layer 164, for example, by a resist stripping process. In some implementations, the patterned resist layer is used as an etch mask to remove portions of mask layer 164 and mask barrier layer 162. In some implementations, the patterned resist layer is used as an etch mask to remove portions of mask layer 164, and mask layer 164 is used as an etching mask to remove portions of mask barrier layer 162 (in some implementations, after removing the patterned resist layer). Alternatively, the exposure process can be implemented or replaced by other methods utilizing maskless lithography, electron-beam lithography, ion-beam lithography, and/or nanoimprint technology.

Figure 10A:
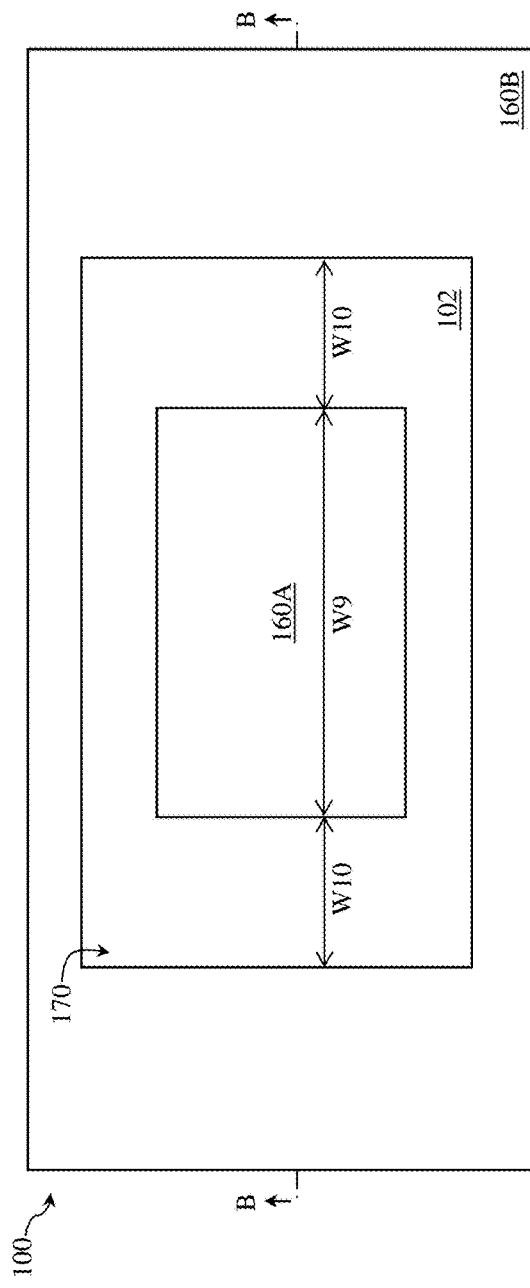
Figure 10B:
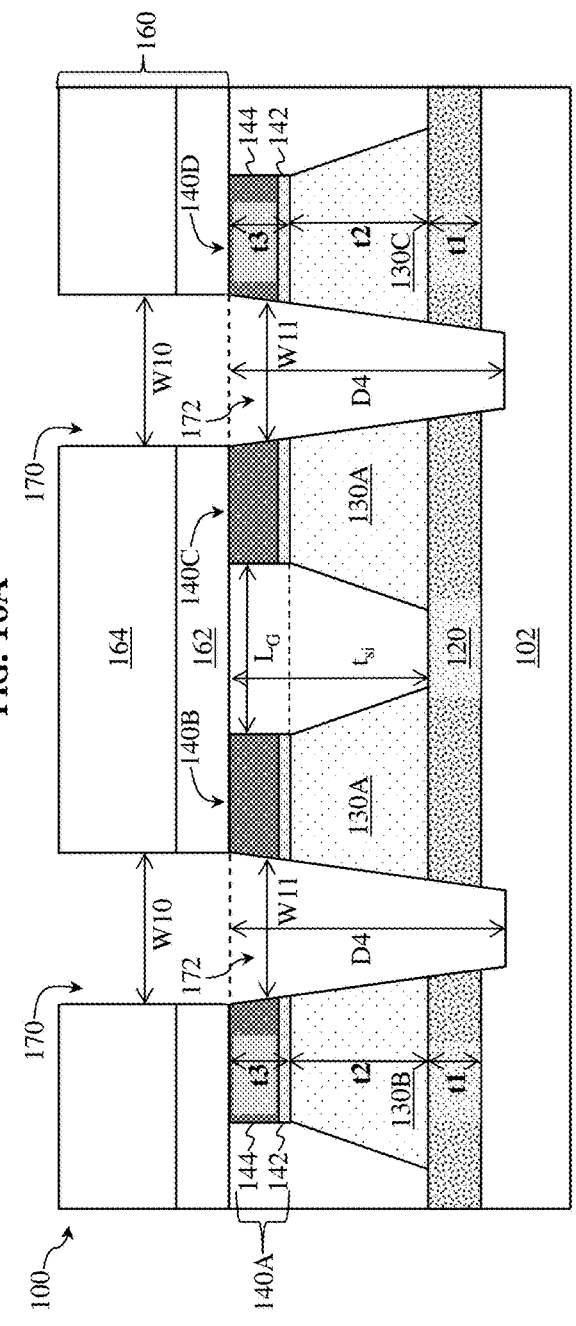

Turning to FIG. 10A and FIG. 10B, an etching process removes portions of epitaxial source/drain features 140 and isolation feature 130 exposed by opening 170, thereby forming an isolation trench 172 that defines an active region of IC device 100, such as an active region of the transistor of IC device 100. Isolation trench 172 has a depth D4 that is greater than or equal to thickness t3 (in other words, D4≥t3). In some implementations, depth D4 is about 50 nm to about 400 nm. The etching process is configured to etch in more than one direction (for example, vertical and horizontal) to achieve a width of isolation trench 172 that decreases as the depth of isolation trench 172 increases. The width of isolation trench 172 thus decreases in a direction toward a bottom surface of isolation trench 172. For example, isolation trench 172 has substantially positively sloped sidewalls (here, oppositely sloped sidewalls compared to isolation trench 112). In other words, sidewalls of isolation trench 172 form an angle less than about 90° (an acute angle) relative to top surface 105 of bulk substrate 102. This results in isolation trench 172 having a tapered width, such as a width W11 that decreases as depth D4 increases (instead of a width that increases with depth, such as isolation trench 112). A width of a top portion of isolation trench 172 is thus greater than a width of a bottom portion of isolation trench 172. The etching process includes dry etching processes, wet etching processes, or combinations thereof. In some implementations, the second etching process is an isotropic etching process.

Isolation trench 172 extends through an entirety of epitaxial source/drain feature 140, thereby creating distinct epitaxial source/drain features of IC device 100, such as an epitaxial source/drain feature 140A, an epitaxial source/drain feature 140B, an epitaxial source/drain feature 140C, and an epitaxial source/drain feature 140D. Isolation trench 172 further extends through at least a portion of isolation feature 130, such that epitaxial source/drain features 140A-140D are sufficiently isolated from one another. For example, in the depicted embodiment, isolation trench 172 extends through an entirety of isolation feature 130. In such implementations, isolation trench 172 may divide isolation feature 130 into distinct isolation features that isolate respective devices of IC device 100, such as an isolation feature 130A that surrounds and isolates channel region 114 of the transistor of IC device 100, an isolation feature 130B that surrounds and isolates another channel region of another device of IC device 100, and an isolation feature 130C that surrounds and isolates yet another device of IC device 100. In some implementations, isolation trench 172 further extends through at least a portion of high resistance layer 120, where the etching process removes portions of high resistance layer 120 exposed by opening 170. For example, in the depicted embodiment, isolation trench 172 also extends through an entirety of high resistance layer 120, though the present disclosure contemplates embodiments where isolation trench extends through only a portion of high resistance layer 120 or to a top surface of high resistance layer 120. In some implementations, various selective etching processes are performed to separately etch epitaxial source/drain feature 140, isolation feature 130, and/or high resistance layer 120.

Figure 11A:
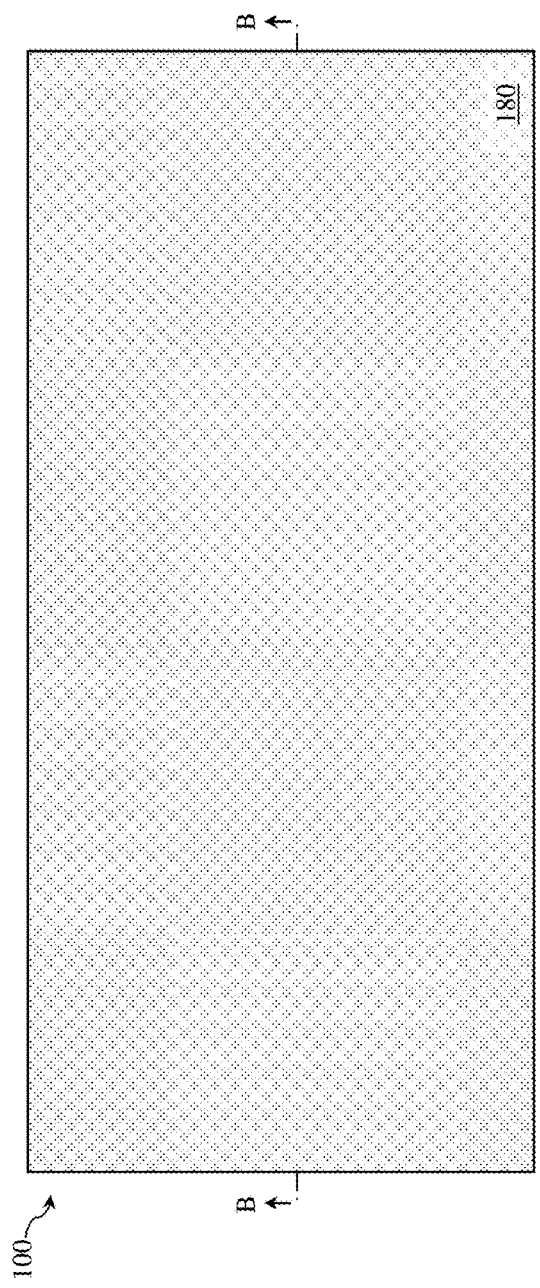
Figure 11B:
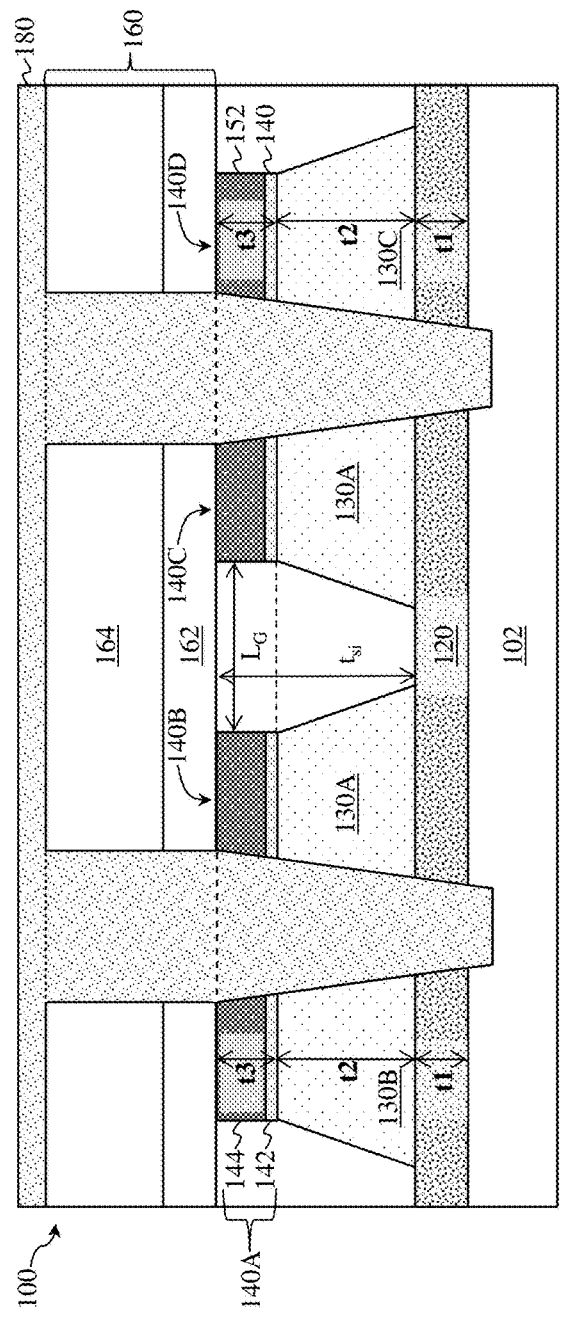

Turning to FIG. 11A and FIG. 11B, a deposition process is performed to fill isolation trench 172 with an isolation material 180. In the depicted embodiment, the isolation material 180 also fills opening 170 of patterning layer 160, and isolation material 180 is disposed over patterning layer 160. Isolation material 180 includes silicon, oxygen, nitrogen, carbon, other suitable isolation constituent, or combinations thereof (for example, silicon oxide, silicon nitride, and/or silicon oxynitride). For example, an HDP-CVD process fills isolation trench 172 (and, in some implementations, opening 170) with an oxide material. In some implementations, isolation material 180 is deposited by CVD, PVD, ALD, a spin-on glass process, other suitable process, or combinations thereof. In some implementations, isolation material 180 is deposited by an FCVD process. In some implementations, isolation material 180 has a multilayer structure, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation material 180 includes a dielectric layer disposed over a doped liner layer (including, for example, BSG or PSG). In some implementations, isolation material 180 and the isolation material of isolation feature 130 include the same materials, layers, thicknesses, and/or structures. In some implementations, isolation material 180 and the isolation material of isolation feature 130 include different materials, layers, thicknesses, and/or structures. Thereafter, turning to FIG. 12A and FIG. 12B, a CMP process or other suitable planarization process can be performed to remove portions of isolation material 180 disposed over patterning layer 160, thereby planarizing a surface of isolation material 180. For example, a top surface of isolation material 180 is substantially planar with a top surface of patterning layer 160 after the planarization process.

Figure 13A:
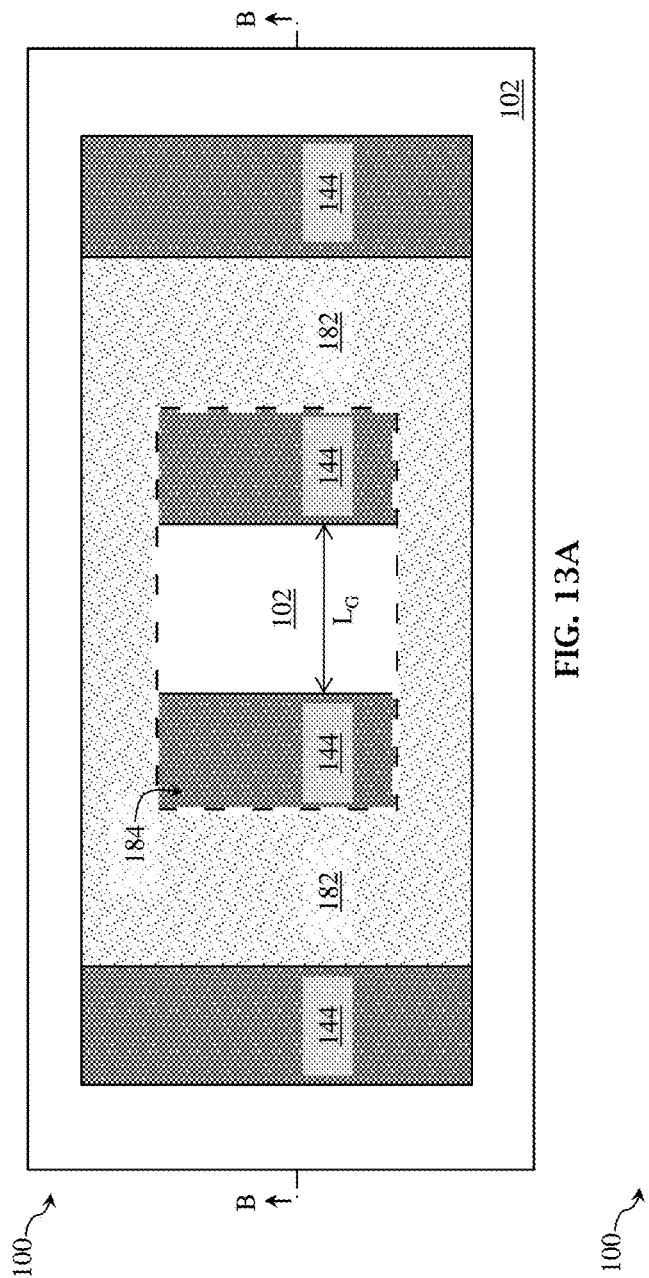
Figure 13B:
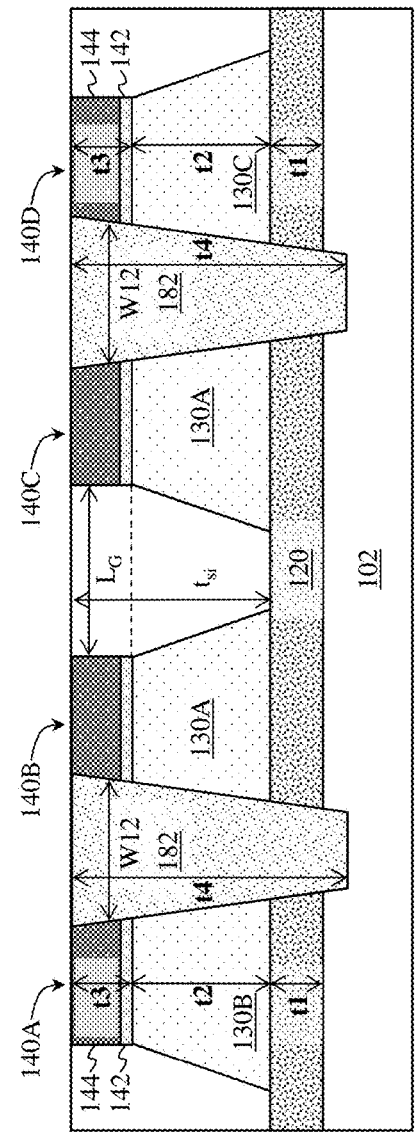

Turning to FIG. 13A and FIG. 13B, a process is performed to remove patterning layer 160 and any excess isolation material 180 (for example, isolation material 180 filling opening 170 and/or disposed above top surface 105 of bulk substrate 102), such that an isolation feature 182 defines an active region 184 (also referred to as an OD region) of IC device 100. Isolation feature 182 surrounds active region 184, which in the depicted embodiment, includes channel region 114 of bulk substrate 102 disposed between epitaxial source/drain feature 140B and epitaxial source/drain feature 140C. In some implementations, active region 184 is configured for the transistor of IC device 100. Isolation feature 182 has a thickness t4 that is substantially equal to depth D4 of isolation trench 172 (in other words, t4≈D4). In some implementations, thickness t4 is about 50 nm to about 400 nm. Isolation feature 182 has a tapered width, where a width of a top portion of isolation feature 182 is greater than a width of a bottom portion of isolation feature 182. For example, isolation feature 182 has positively sloped sidewalls, such that a width W12 of isolation feature 182 decreases as thickness t4 increases, where in the depicted embodiment, width W12 is substantially equal to width W11 of isolation trench 172 (in other words, W12≈W11). Accordingly, active region 184 of the transistor of IC device 100 also has a tapered width, where active region 184 has negatively sloped sidewalls, such that a width of active region 184 increases as its depth increases. In furtherance of the depicted embodiment, width W12 of isolation feature 182 is less than width W8 of isolation feature 130 (in other words, W12<W8). In some implementations, width W12 is about 40 nm to about 300 nm. In some implementations, width W12 is greater than about 300 nm depending on spacing between adjacent devices, such as device pitch. In some implementations, dry etching processes, wet etching processes, or combinations thereof are implemented to remove patterning layer 160 and/or isolation material 180. In some implementations, various selective etching processes are performed to separately etch isolation material 180, mask layer 164, and/or mask barrier layer 162. In some implementations, a planarization process, such as a CMP process, is performed to planarize a surface of IC device 100, such that a top surface of isolation feature 182 is substantially planar with top surface 105 of bulk substrate 102. Isolation material 180, mask layer 164, and/or mask barrier layer 162 can be removed during the planarization process.

Isolation feature 182, isolation feature 130A, and high resistance layer 120 completely isolate active region 184 and/or channel region 114, such that active region 184 and/or channel region 114 are not connected to other active regions and/or other channel regions of IC device 100. Such configuration provides isolation characteristics and crosstalk suppression characteristics equivalent to those achieved by SOI substrates, such that a transistor fabricated in active region 184 exhibits improved performance.

Figure 14A:
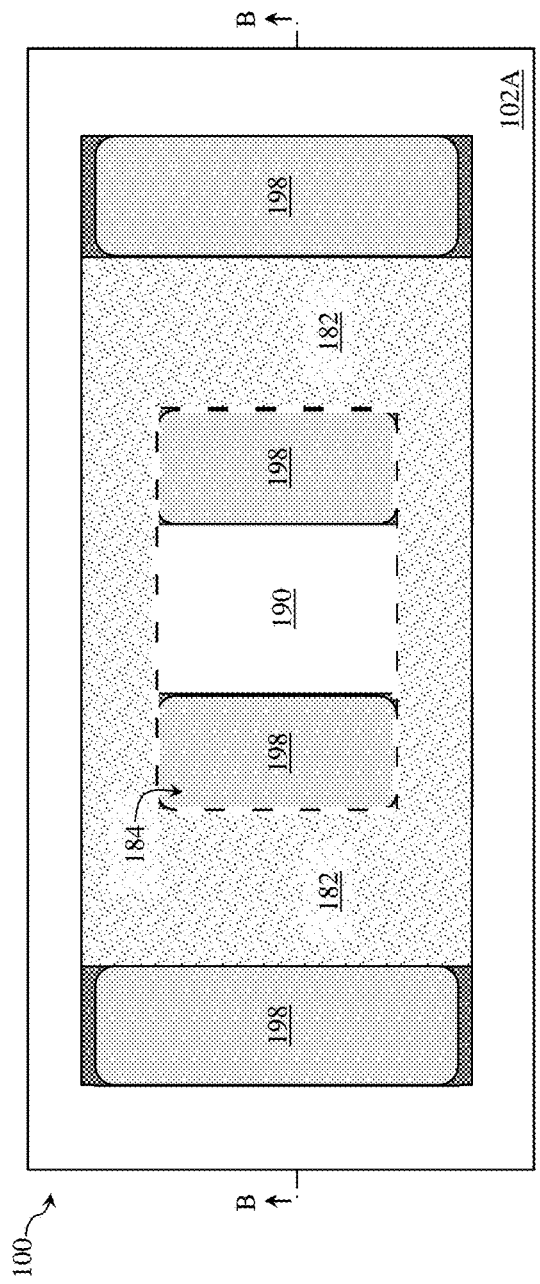
Figure 14B:
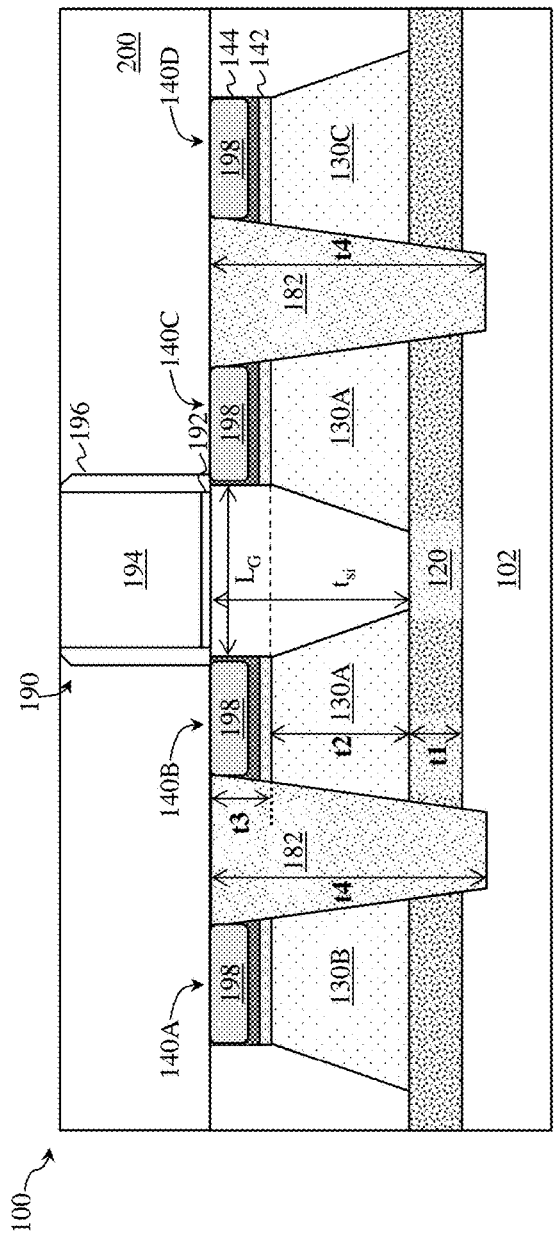

Turning to FIG. 14A and FIG. 14B, a gate structure 190 is formed over channel region 114 of bulk substrate 102 (which is defined by isolation feature 130A), such that gate structure 190 interposes epitaxial source/drain features 140. During operation of IC device 100, current can flow in channel region 114 between epitaxial source/drain features 140B, 140C. Gate structure 190 includes a gate stack configured to achieve desired functionality according to design requirements of IC device 100. In the depicted embodiment, a gate stack of gate structure 190 includes a gate dielectric 192 and a gate electrode 194. Gate dielectric 192 is disposed on channel region 114 of bulk substrate 102, and gate electrode 194 is disposed on gate dielectric 192. In some implementations, gate dielectric 192 is conformally disposed on sidewall surfaces and bottom surfaces of IC device 100 defining the gate stack of gate structure 190, such that gate dielectric 192 is generally u-shaped and has a substantially uniform thickness. Gate dielectric 192 includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, gate dielectric 132 can include a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. Gate electrode 194 includes an electrically conductive material. In some implementations, gate electrode 194 includes multiple layers, such as one or more capping layers, work function layers, glue/barrier layers, and/or metal fill (or bulk) layers. A capping layer can include a material that prevents or eliminates diffusion and/or reaction of constituents between gate dielectric 192 and other layers of gate structure 190. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Gate structure 190 further includes gate spacers 196 disposed adjacent to (for example, along sidewalls of) the gate stack. Gate spacers 196 are formed by any suitable process and include a dielectric material. The dielectric material can include silicon, oxygen, carbon, nitrogen, other suitable material, or combinations thereof. For example, a dielectric layer including silicon and nitrogen, such as a silicon nitride layer, can be deposited over bulk substrate 102 and the gate stack (here, gate dielectric 192 and gate electrode 194) and subsequently anisotropically etched to form gate spacers 196. In some implementations, gate spacers 196 include a multilayer structure, such as a first dielectric layer that includes silicon nitride and a second dielectric layer that includes silicon oxide. In some implementations, gate spacers 196 include more than one set of spacers, such as seal spacers, offset spacers, sacrificial spacers, dummy spacers, and/or main spacers, formed adjacent to the gate stack. In such implementations, the various sets of spacers can include materials having different etch rates. For example, a first dielectric layer including silicon and oxygen can be deposited and subsequently anisotropically etched to form a first spacer set adjacent to the gate stack, and a second dielectric layer including silicon and nitrogen can be deposited and subsequently anisotropically etched to form a second spacer set adjacent to the first spacer set.

Implantation, diffusion, and/or annealing processes is performed to form source feature and drain features (generally referred to as source/drain features 198) in epitaxial source/drain features 140A-140D before and/or after forming gate spacers 196. Source/drain features 198 include lightly doped source and drain (LDD) features and/or heavily doped source and drain (HDD) features. In some implementations, source/drain features 198 are formed by implanting and/or diffusing n-type dopants, p-type dopants, or combinations thereof into epitaxial source/drain features 140A-140D depending on a desired transistor configuration (for example, PMOS or NMOS). An annealing process, such as a rapid thermal annealing (RTA) and/or a laser annealing, can be performed to activate dopants of source/drain features 198 and/or epitaxial source/drain features 140A-140D.

An interlevel dielectric (ILD) layer 200 is also formed over bulk substrate 102. ILD layer 200 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some implementations, ILD layer 200 has a multilayer structure having multiple dielectric materials. In some implementations, a contact etch stop layer (CESL) is disposed between ILD layer 200 and bulk substrate 102 and/or gate structure 190. The CESL includes a material different than ILD layer 200, such as a dielectric material that is different than the dielectric material of ILD layer 200. In the depicted embodiment, where ILD layer 200 includes a low-k dielectric material, the CESL includes silicon and nitrogen (for example, silicon nitride or silicon oxynitride). ILD layer 200 and/or the CESL is formed by, for example, a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 200 and/or the CESL is formed by an FCVD process. Subsequent to the deposition of ILD layer 200 and/or the CESL, a CMP process and/or other planarization process is performed, such that a top portion of gate structure 190 is reached (exposed). In some implementations, a top surface of gate structure 190 is substantially planar with a top surface of ILD layer 200.

The gate stack of gate structure 190 is fabricated according to a gate last process, a gate first process, or a hybrid gate last/gate first process. In gate last process implementations, gate structure 190 includes a dummy gate stack that is subsequently replaced with metal gate stacks. The dummy gate stack includes, for example, an interfacial layer (including, for example, silicon oxide) and a dummy gate electrode layer (including, for example, polysilicon). In such implementations, the dummy gate electrode layer is removed to form an opening (trench) in which gate dielectric 192 and/or gate electrode 194 are subsequently formed. In some implementations, the dummy gate stack is formed before forming ILD layer 200, and the dummy gate stack replaced with a metal gate stack after forming ILD 200. Gate last processes and/or gate first processes can implement deposition processes, lithography processes, etching processes, other suitable processes, or combinations thereof. The deposition processes include CVD, PVD, ALD, HDPCVD, MOCVD, RPCVD, PECVD, LPCVD, ALCVD, APCVD, plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

Figure 15A:
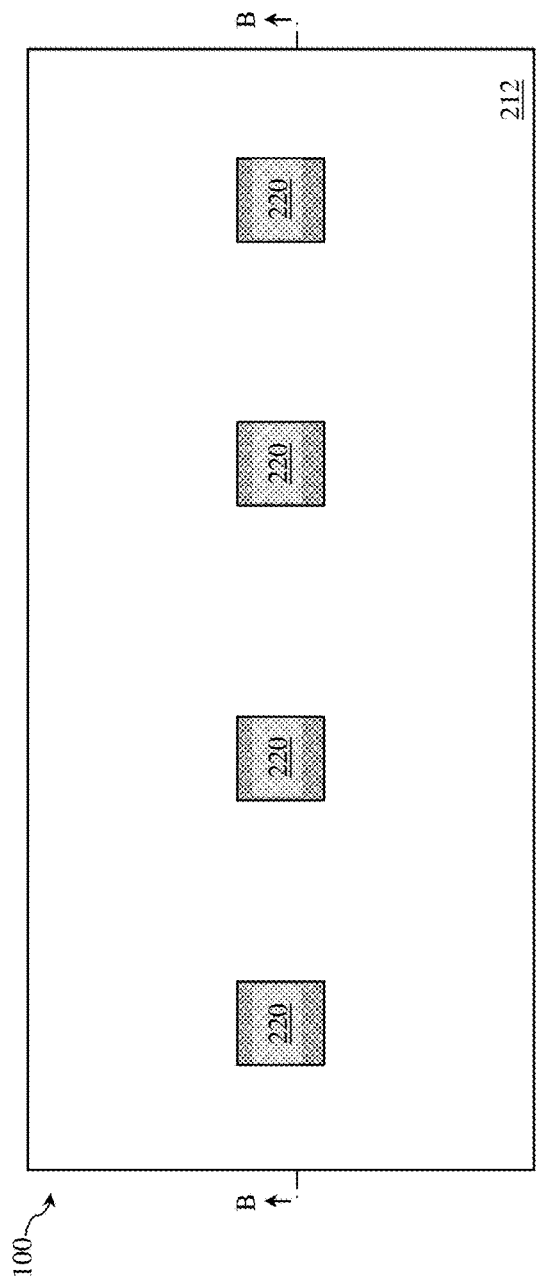
Figure 15B:
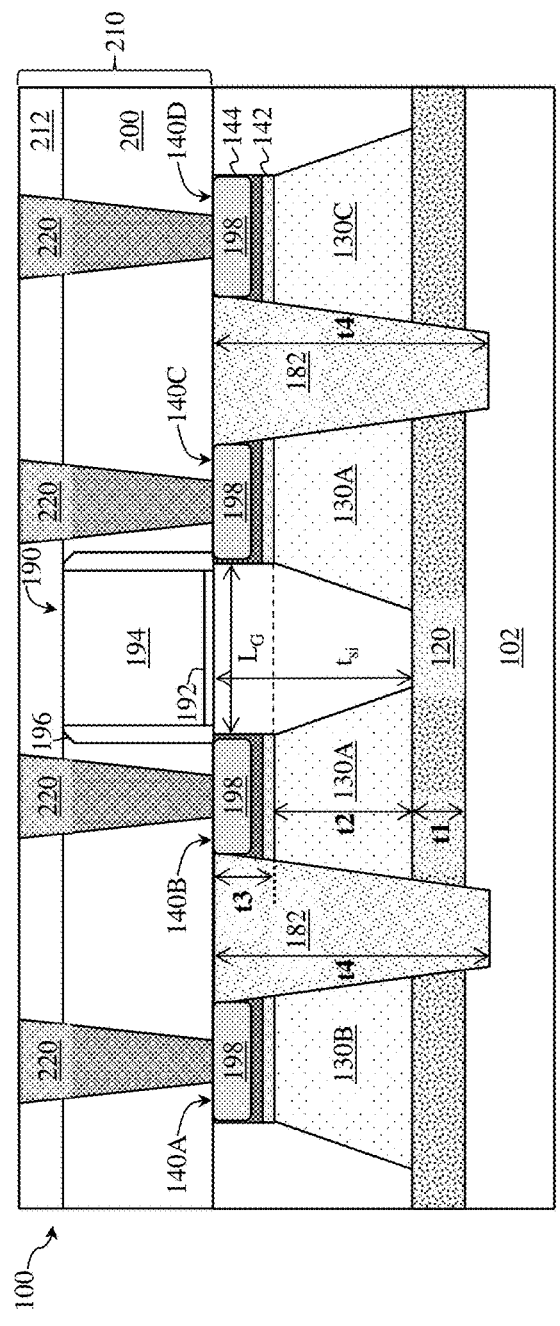

Turning to FIG. 15A and FIG. 15B, ILD layer 200 is a portion of a multilayer interconnect (MLI) feature 210 disposed over bulk substrate 102, where processing continues to form various features of MLI feature 210. MLI feature 210 electrically couples various devices and/or components of IC device 100, such that the various devices and/or components can operate as specified by design requirements of IC device 100. MLI feature 210 includes a combination of dielectric layers and electrically conductive layers (for example, metal layers) configured to form various interconnect structures. The conductive layers are configured to form vertical interconnect features, such as contacts and/or vias, and/or horizontal interconnect features, such as conductive lines. Vertical interconnect features typically connect horizontal interconnect features in different layers (or different planes) of MLI feature 210. During operation of IC device 100, the interconnect features are configured to route signals between the devices and/or the components of IC device 100 and/or distribute signals (for example, clock signals, voltage signals, and/or ground signals) to the devices and/or the components of IC device 100. It is noted that though MLI feature 210 is depicted with a given number of dielectric layers and conductive layers, the present disclosure contemplates MLI feature 210 having more or less dielectric layers and/or conductive layers.

An intermetal dielectric (IMD) layer 212 of MLI feature 210 is formed over ILD layer 200. IMD layer 210 is similar to IMD layer 200. For example, IMD layer 210 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK® (Dow Chemical, Midland, Mich.), polyimide, other low-k dielectric material, or combinations thereof. In the depicted embodiment, IMD layer 212 includes a low-k dielectric material. IMD layer 212 can include a multilayer structure. IMD layer 212 can be formed by a deposition process, such as CVD, PVD, ALD, FCVD, HDPCVD, MOCVD, RPCVD, PECVD, LPCVD, ALCVD, APCVD, other suitable deposition process, or combinations thereof. In some implementations, a CESL is disposed between IMD layer 210 and ILD layer 200.

Contacts 220 are disposed in one or more dielectric layers of MLI feature 210, such as ILD layer 200 and/or IMD layer 212, to form portions of interconnect structures. Contacts 220 electrically couple and/or physically couple IC device features, such as source/drain regions (for example, epitaxial source/drain features 140A-140D and/or source/drain features 198) and/or gate structures (for example, gate structure 190), to vias and/or conductive lines of MLI feature 210. Contacts 220 include any suitable electrically conductive material, such as Ta, Ti, Al, Cu, Co, W, TiN, TaN, other suitable conductive materials, or combinations thereof. Various conductive materials can be combined to provide contacts 220 with various layers, such as a barrier layer, an adhesion layer, a liner layer, a bulk layer, other suitable layer, or combinations thereof. Contacts 220 are formed by patterning ILD layer 200 and/or IMD layer 212. Patterning ILD layer 200 and/or IMD layer 212 can include lithography processes and/or etching processes to form openings (trenches), such as contact openings in ILD layer 200 and/or IMD layer 212. In some implementations, the lithography processes include forming a resist layer over ILD layer 200 and/or IMD layer 212, exposing the resist layer to patterned radiation, and developing the exposed resist layer, thereby forming a patterned resist layer that can be used as a masking element for etching opening(s) in ILD layer 200 and/or IMD layer 212. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 200, IMD layer 212, and/or contacts 220. Fabrication can continue with forming various vias and/or conductive lines of MLI feature 210.

Figure 16:
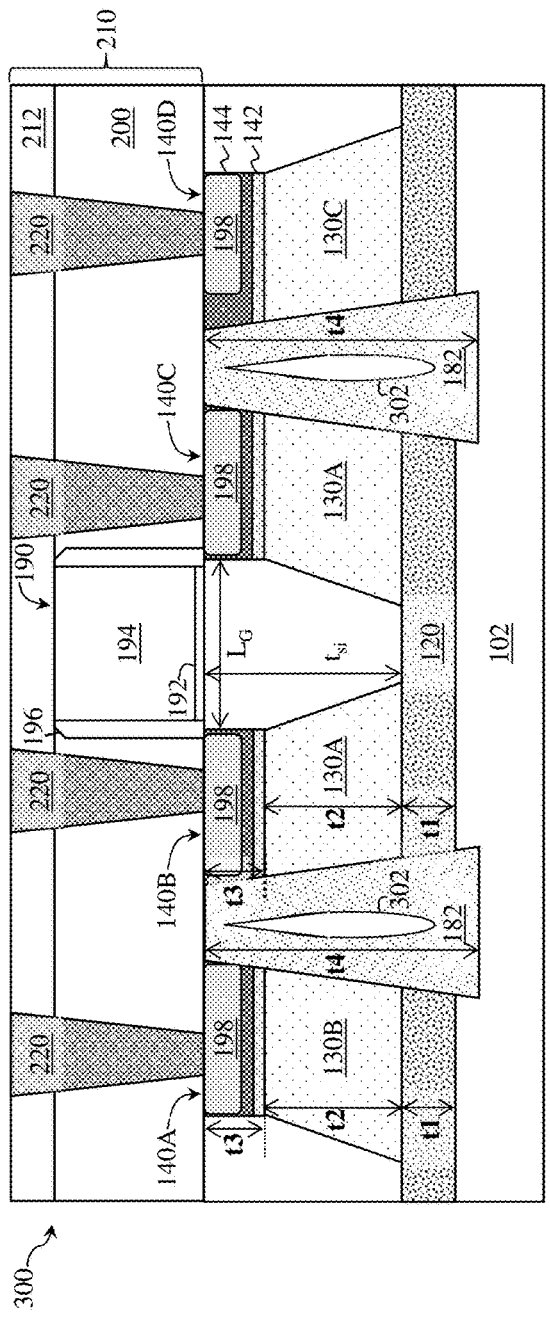
FIG. 16 is a diagrammatic cross-sectional view of another IC device, in portion or entirety, according to various aspects of the present disclosure.
Figure 17:
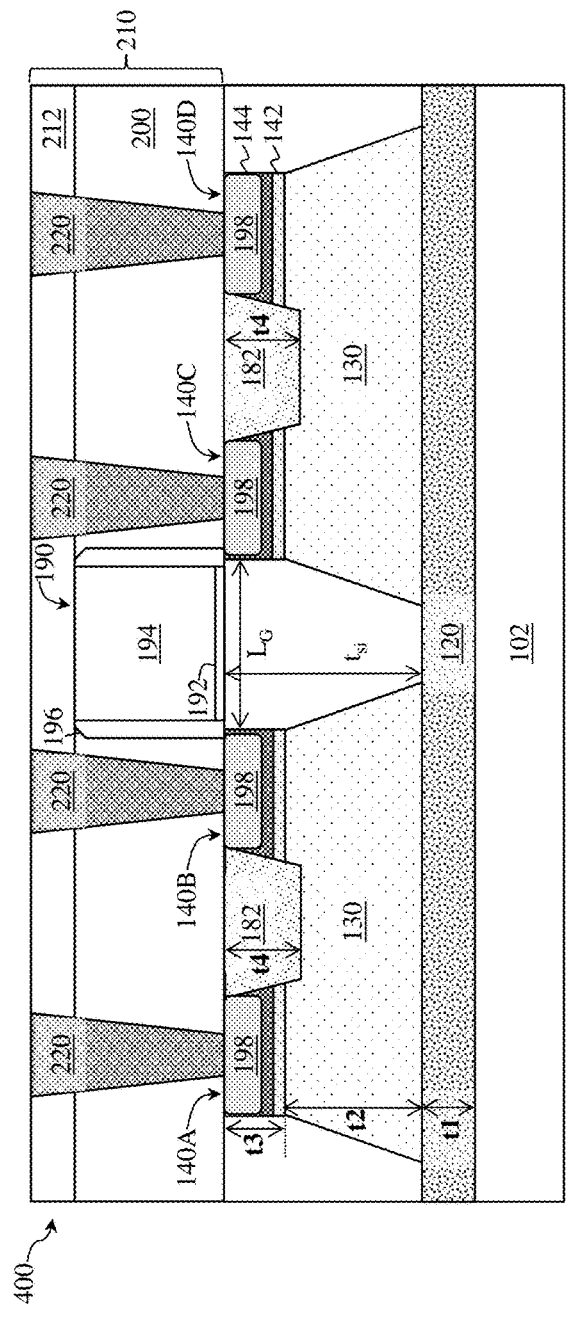
FIG. 17 is a diagrammatic cross-sectional view of yet another IC device, in portion or entirety, according to various aspects of the present disclosure.

FIG. 16 is a diagrammatic cross-sectional view of an IC device 300, in portion or entirety, according to various aspects of the present disclosure. For clarity and simplicity, similar features of IC device 100 in FIGS. 2A-15A and FIGS. 2B-15B and IC device 300 in FIG. 17 are identified by the same reference numerals. For example, IC device 300 includes bulk substrate 102 having a channel region 114, high resistance layer 120 underlying channel region 114 and isolation feature 130, epitaxial source/drain features 140A-140D disposed on isolation feature 130, isolation feature 182, active region 184, gate structure 190 (including, for example, gate dielectric 192, gate electrode 194, and gate spacers 196), and MLI feature 210 (including, for example, ILD layer 200, IMD layer 212, and contacts 220). IC device 300 may be included in a microprocessor, a memory, and/or other IC device. In some implementations, IC device 300 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The various transistors may be planar transistors or multi-gate transistors, such as FinFETs, depending on design requirements of IC device 300. FIG. 16 has been simplified for the sake of clarity to better understand the inventive concepts of the present disclosure. Additional features can be added in IC device 300, and some of the features described below can be replaced, modified, or eliminated in other embodiments of IC device 300.

IC device 300 includes a bulk substrate that is configured to exhibit SOI behavior. IC device 300 is similar in many respects to IC device 100, except isolation feature 182 has negatively sloped sidewalls and active region 184 has positively sloped sidewalls, such that a width of isolation feature 182 increases as thickness t4 increases and a width of active region 184 decreases as thickness $t_{si}$ of channel region 114 increases. Isolation feature 182 further includes an air gap 302. In some implementations, isolation feature 182 has a high aspect ratio, such that air gap 302 can be formed during deposition of isolation material 180. In the depicted embodiment, air gap 302 has a width that increases as thickness t4 increases. Air gap 302 can further enhance isolation between adjacent active regions of IC device 100, thereby enhancing crosstalk suppression between the adjacent active regions.

FIG. 17 is a diagrammatic cross-sectional view of an IC device 400, in portion or entirety, according to various aspects of the present disclosure. For clarity and simplicity, similar features of IC device 100 in FIGS. 2A-15A and FIGS. 2B-15B and IC device 400 in FIG. 17 are identified by the same reference numerals. For example, IC device 400 includes bulk substrate 102 having a channel region 114, high resistance layer 120 underlying channel region 114 and isolation feature 130, epitaxial source/drain features 140A-140D disposed on isolation feature 130, isolation feature 182, active region 184, gate structure 190 (including, for example, gate dielectric 192, gate electrode 194, and gate spacers 196), and MLI feature 210 (including, for example, ILD layer 200, IMD layer 212, and contacts 220). IC device 400 may be included in a microprocessor, a memory, and/or other IC device. In some implementations, IC device 400 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The various transistors may be planar transistors or multi-gate transistors, such as FinFETs, depending on design requirements of IC device 400. FIG. 17 has been simplified for the sake of clarity to better understand the inventive concepts of the present disclosure. Additional features can be added in IC device 400, and some of the features described below can be replaced, modified, or eliminated in other embodiments of IC device 400.

IC device 400 includes a bulk substrate that is configured to exhibit SOI behavior. IC device 400 is similar in many respects to IC device 100, except isolation feature 182 extends through only a portion of isolation feature 130, instead of an entirety of isolation feature 130. For example, isolation feature 182 extends through an entirety of epitaxial source/drain feature 140, defining epitaxial source/drain features 140A-140D, and through a top surface (or top portion) of isolation feature 130. Thickness t4 is thus greater than or equal to thickness t3 and less than a sum of thickness t3 and thickness t2 (in other words, t2+t3>t4≥t3). In such implementations, isolation feature 182 does not divide isolation feature 130 into distinct isolation features (such as isolation features 130A-130C) for adjacent active regions of IC device 100, such that isolation feature 130 extends continuously between adjacent active regions. In the depicted embodiment, isolation feature 130 underlies epitaxial source/drain features of adjacent devices of IC device 100, such as epitaxial source/drain features 140A-140D, which respectively belong to three different devices of IC device 100 (for example, a transistor that includes epitaxial source/drain feature 140A, a transistor that includes epitaxial source/drain features 140B, 140C, and a transistor that includes epitaxial source/drain feature 140C). The present disclosure further contemplates embodiments where isolation feature 182 stops at a top surface of isolation feature 182 (in other words, t4≈t3).

FIG. 18A is diagrammatic top views of an IC device 500, in portion or entirety, that includes an SOI-like structure, according to various aspects of the present disclosure. FIG. 18B is diagrammatic cross-sectional views of IC device 600, in portion or entirety, respectively along line B-B of FIG. 18A, according to various aspects of the present disclosure. For clarity and simplicity, similar features of IC device 100 in FIGS. 2A-15A and FIGS. 2B-15B and IC device 500 in FIG. 18A and FIG. 18B are identified by the same reference numerals. IC device 600 is similar to IC device 100, except isolation feature 182 is depicted as separating adjacent device regions of bulk substrate 102, such as active region 584A and active region 584B, each of which is configured for a single finger IC device, such as a transistor 500A and a transistor 500B. For example, active region 584A and active region 584B are each defined (surrounded) by isolation feature 182, such that active region 584A includes a channel region 114A disposed between epitaxial source/drain features 140A, 140B and active region 584B includes a channel region 114B disposed between epitaxial source/drain features 140C, 140D. Isolation feature 182 thus separates and isolates source/drain regions of adjacent devices. In furtherance of the example, isolation feature 130A underlies epitaxial source/drain features 140A, 140B of active region 584A, and isolation feature 130B underlies epitaxial source/drain features 140C, 140D of active region 584B. Isolation features 130A, 130B further underlie a portion of a top portion of channel region 114A and channel region 114B, respectively. High resistance layer 120 is disposed under channel regions 114A, 114B and isolation features 130A, 130B. Such configuration of IC device 500 completely isolates channel regions 114A, 114B and source/drain regions of IC device 600 (here, including epitaxial source/drain features 140A-140D) and further completely isolates active region 584A from active region 584B, such that adjacent active regions 584A, 584B of IC device 600 are not connected. The present disclosure contemplates implementations where isolation feature 182 does not extend through high resistance layer 120 and/or isolation features 130. IC device 500 may be included in a microprocessor, a memory, and/or other IC device. In some implementations, IC device 500 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The various transistors may be planar transistors or multi-gate transistors, such as FinFETs, depending on design requirements of IC device 500. FIG. 18A and FIG. 18B have been simplified for the sake of clarity to better understand the inventive concepts of the present disclosure. Additional features can be added in IC device 500, and some of the features described below can be replaced, modified, or eliminated in other embodiments of IC device 500.

Figure 19A:
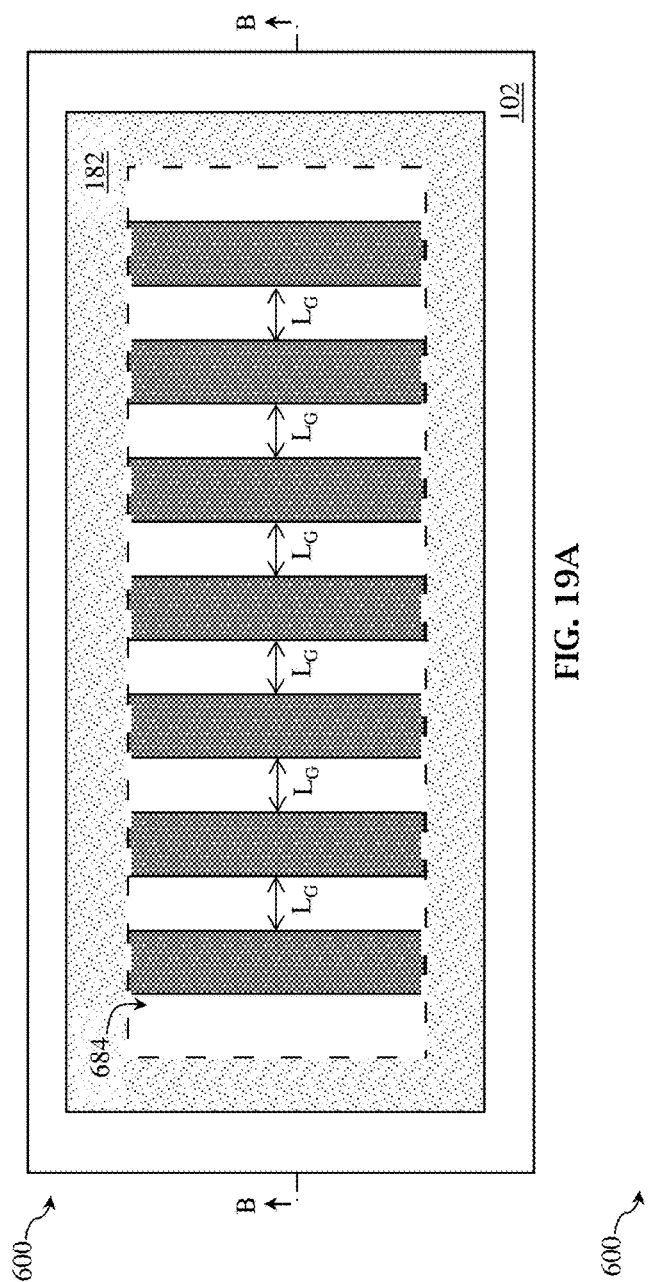
FIG. 19A is a diagrammatic top views of an IC device, in portion or entirety, according to various aspects of the present disclosure.
Figure 19B:
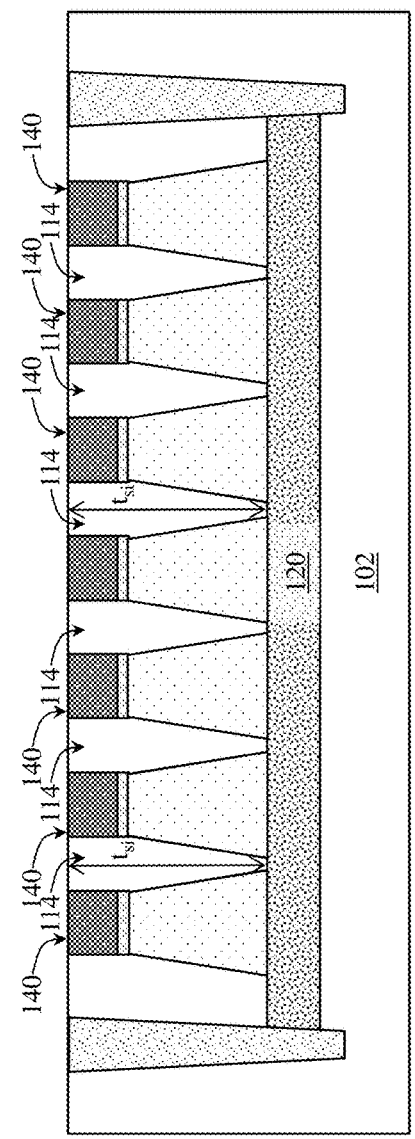
FIG. 19B is a diagrammatic cross-sectional view of the IC device, in portion or entirety, respectively along line B-B of FIG. 19A, according to various aspects of the present disclosure.

FIG. 19A is diagrammatic top views of an IC device 600, in portion or entirety, that includes an SOI-like structure, according to various aspects of the present disclosure. FIG. 19B is diagrammatic cross-sectional views of IC device 600, in portion or entirety, respectively along line B-B of FIG. 19A, according to various aspects of the present disclosure. For clarity and simplicity, similar features of IC device 100 in FIGS. 2A-15A and FIGS. 2B-15B and IC device 600 in FIG. 19A and FIG. 19B are identified by the same reference numerals. IC device 600 is similar to IC device 100, except isolation feature 182 is depicted as surrounding and defining an active region 684 of bulk substrate 102 configured for a multiple finger IC device, such as a transistor. For example, active region 684 includes multiple channel regions 114, where each channel region 114 is disposed between respective epitaxial source/drain features 140. Isolation feature 192 thus separates and isolates the multiple finger IC device from other devices of IC device 600. In furtherance of the example, each epitaxial source/drain feature 140 is disposed on a respective isolation feature 130. Each isolation feature 130 further underlies a portion of a top portion of its respective channel region 114. High resistance layer 120 is disposed under channel regions 114 and isolation features 130. Such configuration of IC device 600 completely isolates channel regions 114 and source/drain regions of IC device 600 (here, including epitaxial source/drain features 140) and active region 684. The present disclosure contemplates implementations where isolation feature 182 does not beyond a depth of epitaxial source/drain features 140, isolation features 130, and/or high resistance layer 120. IC device 600 may be included in a microprocessor, a memory, and/or other IC device. In some implementations, IC device 600 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The various transistors may be planar transistors or multi-gate transistors, such as FinFETs, depending on design requirements of IC device 600. FIG. 19A and FIG. 19B have been simplified for the sake of clarity to better understand the inventive concepts of the present disclosure. Additional features can be added in IC device 600, and some of the features described below can be replaced, modified, or eliminated in other embodiments of IC device 600.

The present disclosure provides for many different embodiments. Bulk substrates configured to exhibit semiconductor-on-insulator (SOI) behavior, and corresponding methods of fabrication, are disclosed herein. Various SOI-like structures are disclosed herein that can be implemented in bulk substrates to achieve SOI behavior. The present disclosure contemplates the SOI-like structures disclosed herein being implemented in any of a variety of device types. For example, aspects of the present disclosure may be implemented to form SOI-like structures for isolating planar field-effect transistors (FETs), multi-gate transistors (planar or vertical), such as FinFET devices, gate-all-around (GAA) devices, omega-gate (Ω-gate) devices, or pi-gate (H-gate) devices, as well as strained-semiconductor devices or other devices. The present disclosure contemplates that one of ordinary skill may recognize other IC devices that can benefit from SOI-like structures described herein.

An exemplary integrated circuit device includes a bulk substrate that exhibits semiconductor-on-insulator behavior. The integrated circuit device includes a channel region defined in the bulk substrate. The channel region has a first portion disposed over a second portion. The first portion is disposed between epitaxial source/drain features disposed in the bulk substrate. The second portion is defined by a first isolation feature disposed in the bulk substrate. The epitaxial source/drain features are disposed on the first isolation feature. A thickness of the channel region is about equal to a sum of a thickness of the first isolation feature and a thickness of the epitaxial source/drain features. The integrated circuit device further includes a second isolation feature disposed in the bulk substrate. The second isolation feature defines an active region that includes the first portion of the channel region disposed between the epitaxial source/drain features. A resistance of a portion of the bulk substrate underlying the first isolation feature and the channel region is greater than a resistance of the bulk substrate. In some implementations, the integrated circuit device further includes an air gap disposed in the second isolation feature, wherein the second isolation feature has a tapered width that increases with depth. In some implementations, the integrated circuit device further includes a gate structure disposed over the channel region.

In some implementations, the channel region has a tapered width that decreases as the thickness of the channel region increases. In some implementations, a width of the first portion is substantially the same as the thickness of the channel region increases and a width of the second portion decreases as the thickness of the channel region increases. In some implementations, a thickness of the second isolation feature is greater than or equal to the thickness of the epitaxial source/drain features. In some implementations, the thickness of the second isolation feature is less than the thickness of the channel region. In some implementations, the thickness of the second isolation feature is greater than the thickness of the channel region. In some implementations, the thickness of the second isolation feature is greater than a sum of the thickness of the channel region and a thickness of the portion of the bulk substrate underlying the first isolation feature and the channel region. In some implementations, the bulk substrate includes a material having a crystalline structure and the portion of the bulk substrate underlying the first isolation feature and the channel region includes the material having a non-crystalline structure.

An exemplary semiconductor-on-insulator like structure includes a bulk substrate and a dual-isolation structure. The dual-isolation structure includes a first isolation trench and a second isolation trench defined in the bulk substrate. The first isolation trench is configured to define a channel region of the bulk substrate. The first isolation trench includes a first isolation trench portion and a second isolation trench portion disposed over the first isolation trench portion. A first isolation material fills the first isolation trench portion of the first isolation trench. An epitaxial material fills the second isolation trench portion of the first isolation trench, wherein the epitaxial material is disposed on the first isolation material. The second isolation trench defines an active region that includes the channel region. A second isolation material fills the second isolation trench. The semiconductor-on-insulator like structure further includes an amorphous layer disposed in the bulk substrate underlying the first isolation trench and the channel region. A resistance of the amorphous layer is greater than a resistance of the bulk substrate. In some implementations, an air gap is disposed in the second isolation material.

In some implementations, the first isolation trench has negatively sloped sidewalls and the second isolation trench has positively sloped sidewalls. In some implementations, the first isolation trench has negatively sloped sidewalls and the second isolation trench has negatively sloped sidewalls. In some implementations, the first isolation trench portion has substantially vertical sidewalls and the second isolation trench portion has negatively sloped sidewalls. In some implementations, the second isolation trench extends through at least a portion of the first isolation trench. In some implementations, the second isolation trench further extends through at least a portion of the amorphous layer.

An exemplary method for fabricating an integrated circuit device, such that a bulk substrate of the integrated circuit device exhibits semiconductor-on-insulator behavior includes forming a first isolation trench in a bulk substrate, wherein the first isolation trench defines a channel region of the bulk substrate; increasing a resistance of a portion of the bulk substrate underlying the first isolation trench and the channel region of the bulk substrate; filling a first portion of the first isolation trench with a first insulator material; filling a second portion of the first isolation trench with a semiconductor material; forming a second isolation trench in the bulk substrate, wherein the second isolation trench defines an active region that includes the channel region; and filling the second isolation trench with a second insulator material. In some implementations, the forming the first isolation trench includes performing a two-step etching process to form the first portion and the second portion. In some implementations, the increasing the resistance of the portion of the bulk substrate underlying the first isolation trench and the channel region of the bulk substrate includes performing an implantation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device that includes a bulk substrate that exhibits semiconductor-on-insulator behavior, the integrated circuit device comprising:
   a channel region defined in the bulk substrate, wherein the channel region has a first portion disposed over a second portion, and further wherein:
      the first portion is disposed between epitaxial source/drain features disposed in the bulk substrate,
      the second portion is defined by a first isolation feature disposed in the bulk substrate, wherein the epitaxial source/drain features are disposed on the first isolation feature, and
      a thickness of the channel region is about equal to a sum of a thickness of the first isolation feature and a thickness of the epitaxial source/drain features;
   a second isolation feature disposed in the bulk substrate, wherein the second isolation feature defines an active region that includes the first portion of the channel region disposed between the epitaxial source/drain features; and
   wherein a resistance of a portion of the bulk substrate underlying the first isolation feature and the channel region is greater than a resistance of the bulk substrate.

2. The integrated circuit device of claim 1, wherein the channel region has a tapered width that decreases as the thickness of the channel region increases.

3. The integrated circuit device of claim 2, wherein a width of the first portion is substantially the same as the thickness of the channel region increases and a width of the second portion decreases as the thickness of the channel region increases.

4. The integrated circuit device of claim 1, wherein a thickness of the second isolation feature is greater than or equal to the thickness of the epitaxial source/drain features.

5. The integrated circuit device of claim 4, wherein the thickness of the second isolation feature is less than the thickness of the channel region.

6. The integrated circuit device of claim 4, wherein the thickness of the second isolation feature is greater than the thickness of the channel region.

7. The integrated circuit device of claim 4, wherein the thickness of the second isolation feature is greater than a sum of the thickness of the channel region and a thickness of the portion of the bulk substrate underlying the first isolation feature and the channel region.

8. The integrated circuit device of claim 1, wherein the bulk substrate includes a material having a crystalline structure and the portion of the bulk substrate underlying the first isolation feature and the channel region includes the material having a non-crystalline structure.

9. The integrated circuit device of claim 1, further comprising an air gap disposed in the second isolation feature, wherein the second isolation feature has a tapered width that increases with depth.

10. The integrated circuit device of claim 1, further comprising a gate structure disposed over the channel region.

11. A semiconductor-on-insulator like structure comprising:
    a bulk substrate;
    a dual-isolation structure that includes:
       a first isolation trench defined in the bulk substrate, wherein the first isolation trench is configured to define a channel region of the bulk substrate, the first isolation trench includes a first isolation trench portion and a second isolation trench portion disposed over the first isolation trench portion, and:
          a first isolation material fills the first isolation trench portion of the first isolation trench; and
          an epitaxial material fills the second isolation trench portion of the first isolation trench, wherein the epitaxial material is disposed on the first isolation material, and
       a second isolation trench defined in the bulk substrate, wherein the second isolation trench defines an active region that includes the channel region, and
    further wherein a second isolation material fills the second isolation trench; and
    an amorphous layer disposed in the bulk substrate underlying the first isolation trench and the channel region, wherein a resistance of the amorphous layer is greater than a resistance of the bulk substrate.

12. The semiconductor-on-insulator like structure of claim 11, wherein the first isolation trench has negatively sloped sidewalls and the second isolation trench has positively sloped sidewalls.

13. The semiconductor-on-insulator like structure of claim 11, wherein the first isolation trench has negatively sloped sidewalls and the second isolation trench has negatively sloped sidewalls.

14. The semiconductor-on-insulator like structure of claim 11, wherein an air gap is disposed in the second isolation material.

15. The semiconductor-on-insulator like structure of claim 11, wherein the first isolation trench portion has substantially vertical sidewalls and the second isolation trench portion has negatively sloped sidewalls.

16. The semiconductor-on-insulator like structure of claim 11, wherein the second isolation trench extends through at least a portion of the first isolation trench.

17. The semiconductor-on-insulator like structure of claim 16, wherein the second isolation trench further extends through at least a portion of the amorphous layer.

18. A transistor comprising:
a bulk substrate;
a first epitaxial source/drain feature and a second epitaxial source/drain feature disposed in the bulk substrate, wherein a first portion of the bulk substrate is defined between the first epitaxial source/drain feature and the second epitaxial source/drain feature;
a first dielectric feature disposed in the bulk substrate, wherein the first dielectric feature is disposed directly adjacent to and under the first epitaxial source/drain feature and the second epitaxial source/drain feature, and further wherein the first dielectric feature surrounds a second portion of the bulk substrate, wherein the second portion of the bulk substrate is disposed under the first portion of the bulk substrate;
a third portion of the bulk substrate disposed directly adjacent to and under the first dielectric feature and the second portion of the bulk substrate, wherein the third portion of the bulk substrate has a non-crystalline structure, the first portion of the bulk substrate has a crystalline structure, and the second portion of the bulk substrate has a crystalline structure;
a second dielectric feature disposed in the bulk substrate, wherein the second dielectric feature surrounds the first dielectric feature and the third portion of the bulk substrate; and
a gate structure disposed over the first portion of the bulk substrate.

19. The transistor of claim 18, wherein the second dielectric feature is disposed directly adjacent to the first epitaxial source/drain feature and the second epitaxial source/drain feature.

20. The transistor of claim 18, wherein the second dielectric feature is disposed directly adjacent to the first portion of the bulk substrate.

* * * * *